United States Patent [19]

Samek

[11] Patent Number: 4,753,517

[45] Date of Patent: Jun. 28, 1988

[54] ELECTROOPTICAL LIGHT GATING METHODS AND APPARATUS

[75] Inventor: Norbert E. Samek, Sierra Madre, Calif.

[73] Assignee: IMO Delaval Incorporated, Lawrenceville, N.J.

[21] Appl. No.: 380,183

[22] Filed: May 20, 1982

Related U.S. Application Data

[63] Continuation-in-part of Ser. No. 34,894, Apr. 30, 1979, Pat. No. 4,478,495, and a continuation-in-part of Ser. No. 225,924, Jan. 19, 1981, abandoned.

[51] Int. Cl.[4] .......... G02F 1/055

[52] U.S. Cl. .......... 350/392

[58] Field of Search .......... 350/392–393, 350/335–336, 339 R, 356, 388, 333, 334, 377, 392; 358/232; 365/141; 340/752, 754; 178/68.5; 339/17 LC, 17 LM, 17 M

[56] References Cited

U.S. PATENT DOCUMENTS

| | | | |
|---|---|---|---|
| 2,936,380 | 5/1960 | Anderson | 350/388 |
| 3,182,574 | 5/1965 | Fleisher et al. | 350/388 |
| 3,955,208 | 5/1976 | Wick et al. | 350/335 |
| 4,040,720 | 8/1977 | York | 350/333 |
| 4,054,385 | 10/1977 | Wheable | 350/333 |
| 4,333,715 | 6/1982 | Brooks | 350/335 |
| 4,335,936 | 6/1982 | Nonomura et al. | 350/336 |
| 4,406,521 | 9/1983 | Mir et al. | 350/392 |
| 4,420,772 | 12/1983 | Jacobs | 350/356 |

FOREIGN PATENT DOCUMENTS

| | | | |
|---|---|---|---|
| 2008786 | 6/1979 | United Kingdom | 350/392 |

OTHER PUBLICATIONS

Hacking et al, "Digital Recording Using Hologram Arrays: Laser-Beam Deflection & Modulation", Research Dept., Engineering Div., British Broadcasting Corp., BBC RD, 1979/6, 3-1979, p. 31.

Cutchen et al, "PLZT Electrooptic Shutters: Applications, App. Optics, 8-1975, pp. 1866–1873.

*Primary Examiner*—William H. Punter

*Attorney, Agent, or Firm*—Benoit Law Corporation

[57] ABSTRACT

Electrooptical light gating methods and apparatus divide pluralities of light gates into distinct groups, each extending along a light gate structure. The light gates are staggered in at least one of these groups relative to light gates in at least another of the groups. At least two of the groups may be arranged on the same light gate structure, and light gates in one of these two groups are then staggered relative to light gates in the other of the two groups on the same light gate structure. On the other hand, at least two of the groups may be arranged on at least two different light gate structures, and light gates on one of the two light gate structures are then staggered relative to light gates on the other of such two light gate structures.

28 Claims, 8 Drawing Sheets

FIG. 1
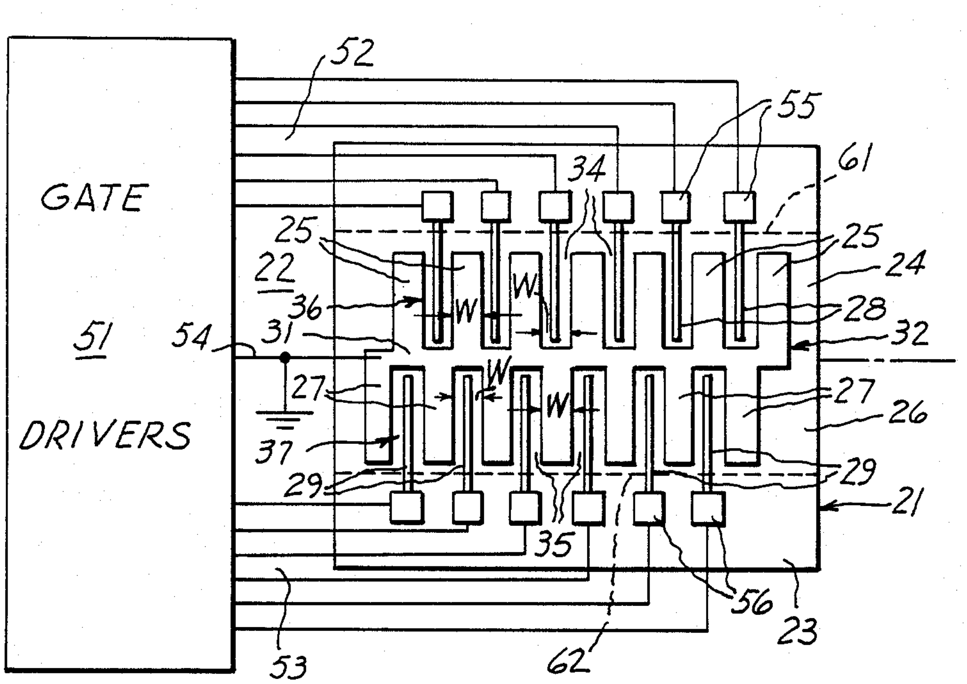
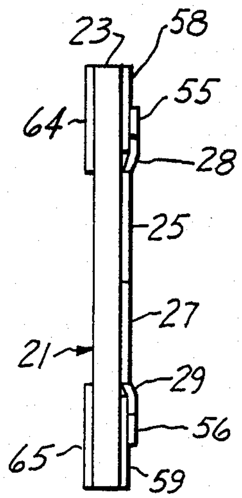
FIG. 2
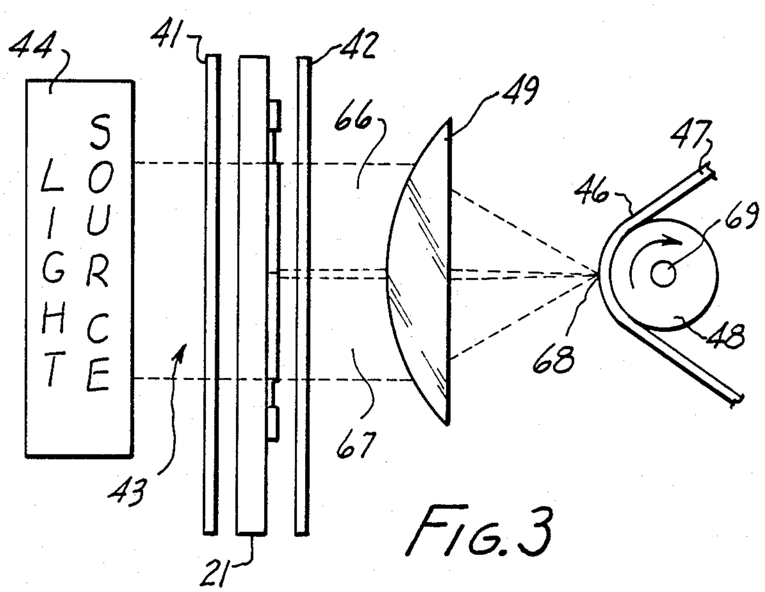
FIG. 3
FIG. 4
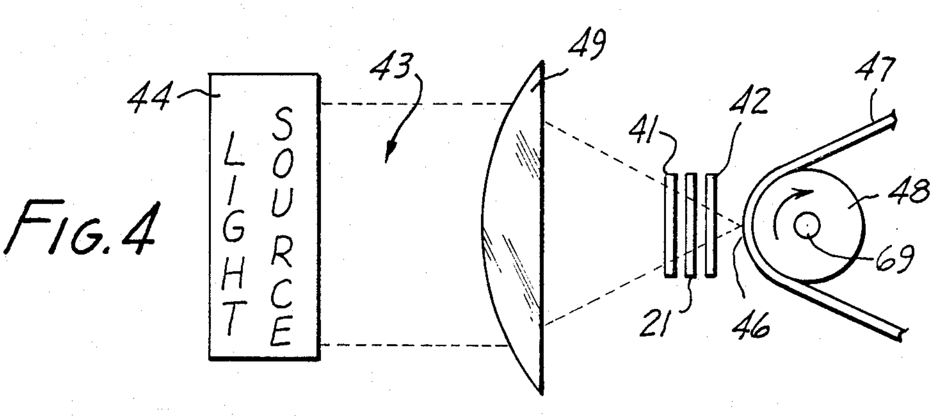

ELECTROOPTICAL LIGHT GATING METHODS AND APPARATUS

CROSS-REFERENCE

This is a continuation in part of two copending patent applications by the subject inventor, namely Ser. No. 06/034,894, filed Apr. 30, 1979, for Light Gate Assemblies, Elements and Manufacturing Methods, (now U.S. Pat. No. 4,478,495, issued Oct. 23, 1984) and Ser. No. 06/225,924, filed Jan. 19, 1981, for Electrooptical Light Gating Methods and Apparatus (now abandoned), both of which are assigned to the common assignee.

BACKGROUND OF THE INVENTION

1. Field of the Invention

The subject invention relates to electrooptical systems, to light gating methods and apparatus, to electrode systems, to technique for increasing feasible electrode and light gate densities, to methods for inhibiting crosstalk or spurious cross-energization between light gates, to features for inhibiting photo-induced birefringence, to techniques for reducing or eliminating electrode degradation, and to methods and apparatus for processing, displaying, recording, writing and reading information.

2. Disclosure Statement

This disclosure statement is made pursuant to the duty of disclosure imposed by law and formulated in 37 CFR 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material though not necessarily being of itself pertinent. Also the following comments contain conclusions and observations which have only been drawn or become apparent after conception of the subject invention or which contrast the subject invention or its merits against the background of developments subsequent in time or priority.

Various electrooptical light gate systems have been proposed in diverse fields of utility. By way of example, reference may be had in this respect to an article by J. Thomas Cutchen et al, entitled Electrooptic Devices Utilizing Quadratic PLZT Ceramic Elements, published in 1973 WESCON TECHNICAL PAPERS, Vol. 17, part 30, pp. 30/2 et seq. These and other articles in the field describe electrooptic ceramics and devices employing transparent lanthanum-modified lead zirconate titanate (PLZT), and application thereof, including page composers, display devices, eye protective devices, industrial welding protection, large aperture photographic shutters and variable density filters.

Facsimile apparatus for writing and reading mechanically moving documents with an electronically controllable switching mask plate, disposed between polarization filters and consisting of a material containing mixed crystals of lead zirconate and lead titanate, doped with lanthanum, and provided with aligned electrodes, were proposed in U.S. Pat. No. 3,930,119, by Rolf Schmidt et al, issued Dec. 30, 1950.

That proposal contemplated use of a switching mask plate having a large number of electrodes arranged in line with one another, or then employment of a plurality of ceramic plates provided with electrodes and stacked so that light beams could be masked according to a raster between the electrodes of the individual plates.

A further proposal is apparent from British Patent Specification No. 1 534 027, by Battelle Memorial Institute, published Nov. 29, 1978. That proposal employs light modulating elements which are arranged side by side, and each of which has the form of an electrooptical shutter. Electrode arrangements are also shown which have comb-like electrode configurations or similar arrangements with a grounded serpentine common electrode located on both major sides of a ceramic plate, with spatial coincidence or registration existing among corresponding electrodes on the two substrate faces.

As representative, though by no means exhaustive, of the vast literature on the subject, reference may also be had to an article by Kei-ichi Ueno and Tadashi Saku, entitled PLZT Spatial Light Modulator for a 1-D Hologram Memory, published in APPLIED OPTICS, Vol. 19, No. 1 (Jan. 1, 1980), and to two papers published by THE BRITISH BROADCASTING CORPORATION (BBC), Research Department, Engineering Division. One of these BBC papers, by K. Hacking and I. Childs, is entitled Digital Recording Using Hologram Arrays: Laser-Beam Deflection and Modulation, BBC RD 1979/6, UDC 621.375.9; 535.8 (March 1979). The other of these BBC papers, by K. Hacking and J. L. Riley, is entitled Digital Recording Using Hologram Arrays: Development of the Transducers for an Experimental 100 M bit/s Recorder, BBC RD 1979/16, UDC 621.375.9; 535.8. This literature starting with the above mentioned 1973 WESCON Technical Papers, expresses considerable concern about crosstalk between light gates of electrooptic devices. In this respect, "crosstalk" is a term of art borrowed from the field of telephony. Since no talk is typically involved in electrooptical light gate systems, the expression "spurious cross-energization" is sometimes used herein instead.

By way of background, the above mentioned 1973 WESCON article, on page 10, deals with the problem of crosstalk and indicates that such problem inhibits a close packing of light gates. To overcome the problem, the particular article recommends a spacing of gates, in a single-aperture structure, on 0.010-inch (0.25 mm) centers. In practice, this imposes a severe limitation on attainable gate density. For the more easily driven dual aperture gate structure, the indicated spacing for crosstalk reduction would even have to be doubled, which would reduce attainable gate density still more.

From comparion, crosstalk may be considered in terms of light transmission in neighboring gates of a given open light gate. In this respect, it has been found in a dual gate structure having a density of 80 gates per inch, with two subgates per gate, that light transmission in a first neighboring gate was still about a fiftieth, in a second neighboring gate about a two-hundredthirtieth, and in a third neighboring gate about a two-hundred-fiftieth of the light transmission in the open reference gate. In a dual gate structure having a density of 256 light gates per inch, light transmissions of a fiftieth, a one-hundred-twenty-fifth, a two-hundred-thirtieth and a two-hundred-fiftieth were determined as taking place in the first, second, third and fourth neighboring gates, respectively, relative to the light transmission through the open reference gate.

Considerable crosstalk reductions were observed from employment of a technique suggested in the above mentioned BBC papers. In this respect, the cited paper by K. Hacking and I. Childs suggests on page 31 that PLZT material be provided outside of the light gates with a layer having a dielectric constant significantly smaller than the relatively high dielectric constant of PLZT material, and that terminals and leads for the light gates be positioned on such dielectric layer in order to reduce crosstalk between adjacent gates.

Using that kind of dielectric layer technique in the above mentioned 80 per inch density gate structure, the spurious light transmission was only a two-hundred-thirtieth in the first neighboring gate, a two-hundred-fiftieth in the second neighboring gate and a three-hundredth in the third neighboring gate, relative to the reference gate. Similarly with the mentioned dielectric layer technique, spurious light transmission in the above mentioned 256 per inch gate density structure was somewhat reduced to about an eightieth, a one-hundred-seventy-sixth and a hundredthirtieth in the first, second and third neighboring gates, respectively, relative to the reference gate.

While these improvements are remarkable, they do not go far enough for some applications and they address themselves more to the light gate terminal structure than to the light gates themselves.

That proposals from other fields offer no solution to the above mentioned problems may, for instance, be seen from a consideration of U.S. Pat. No. 3,124,635, by E. M. Jones et al, issued Mar. 10, 1964, and proposing several electrode structures for photoelectric musical instruments and the like, U.S. Pat. No. 3,452,342, by J. I. Raffel, issued June 24, 1969, and proposing strip conductor designs for high-capacity memory circuit arrangements, and British Patent Specification No. 1 411 846, by Michael N. Ernstoff et al, published Oct. 29, 1975, and disclosing electronically switched field sequential color television systems with interdigitated electrode structures.

References cited in the above mentioned literature and patent papers, as well as references cited elsewhere herein, may also be considered in this context.

Another problem that has so far beset electrooptical light gate systems, such as PLZT light shutters or gate arrays, may be designated as "photoinduced birefringence." Such undesired birefringence occurs, for instance, when light gates are illuminated at high intensity while electric fields are applied to the gates, such as to place the gates in their ON condition. In short, photoinduced birefringence degrades the performance of light gates, and particularly their light transmitting capability.

While no limitation to or dependence on any particular theory is intended, it may be observed that a cause of photoinduced birefringence is believed to be photoexcitation of electrons in the illuminated region where electrons can reach the conduction state and drift under the influence of the applied field. Such photoinduced charge carriers are being trapped in the dark regions of the electrooptical material layer; particularly in close proximity to the edges of the electrode deposits. In brief, the trapped photoinduced charge carriers generate a space charge field which acts against the field applied to the electrodes and gating regions. The localized charge at the boundary of the illuminated area grows at a rate proportionate to the difference of free carrier concentration in the illuminated and in the dark areas, which in turn is dependent on the light and field intensities. By way of example, up to 45% decrease in light transmission was observed with PLZT light gate arrays after 90 minutes of intense illumination.

Especially with PLZT light gate systems, the rule of thumb has developed that the interelectrode spacing, that is, the spacing between immediately adjacent electrodes, should not be smaller than the thickness of the layer of electrooptically active material. Such relationship, in effect, provides a favorable distribution of the applied electric fields throughout the thickness of the electrooptically active material, thereby reducing the above mentioned light induced birefringence effect. However, the latter rule of thumb places severe restrictions on a reduction of interelectrode spacing for a given thickness of the electrooptically active substrate or layer. As a result, existing systems are either subject to light induced birefringence at a detrimental rate or suffer a severe limitation on the attainment of desirable properties, such as an achievement of high resolution.

Prior proposals, such as those contained in the above mentioned Schmidt et al patent, in U.S. Pat. No. 3,799,647, by Victor Luft, in British Patent Specification No. 1 465 673, by R. W. Cooper, incidentally showing illumination through the side of an electrooptical layer opposite the electroded side, and in an article by W. F. Gilmore, entitled "Printed Circuit Generator," IBM Technical Disclosure Bulletin, Vol. 12, No. 7 (December 1969), showing illumination through the length or width of an electrooptical crystal, offer no solution of this serious problem.

Similarly, even though angled profiles have been used in breadboard structures since vacuum tube radio days, as may be seen from an advertisement for "ZAK Breadboards," 1955-03 (March, 1955) pp. 3-7, the prior art has been attempting to bond electrooptical light gate materials with substrates having different coefficients of expansion and other characteristics, thereby inducing strain in the electrooptical light gate material and otherwise impeding the proper operation of the desired light gating function.

Moreover, even though different electrode widths and spacings have been proposed in the past, including wider, as well as narrower gaps than the electrode width, the prior art most likely used equal electrode widths and spacings or did at least not show any particular preference either way. Reference may in this respect be had to the above mentioned 1973 WESCON Technical Papers, such as pp. 9 and 10, and to the article "PLZT Electrooptic Shutters: Applications," by J. Thomas Cutchen, et al, APPLIED OPTICS, Vol. 14, No. 8 (August 1975), such as pp. 1871 and 1872, describing linear array page composers having a gap width smaller than the electrode width, as well as having equal gap and electrode widths.

The above mentioned Hacking et al paper, BBC RD 1979/6 also deals with the subject of design of electrodes such as on pages 24 to 26 thereof, commenting that for a smaller gap dimension, the width of the electrodes should be at least twice the gap dimension to insure maximum field at the center of the gap for a given applied voltage, and commenting further that, in practice, the corners of the electrodes are rounded thus reducing the area of uniform field inside the PLZT.

Closer examination of these statements, particularly in the light of FIG. 19 of the particular BBC paper, shows that that paper is referring to an electrode arrangement in which the light gate gap is located between smaller electrode ends, with the electrodes themselves being aligned with their longitudinal dimensions along an axis traversing the light gate gap and with the electrode thus facing each other with their small ends across such light gate gap. Reference may also be had to the article "A Linear Electrooptic Effect in Ferroelectric Ceramics: PLZT 12/40/60," by Philip D. Thacher, FERROELECTRICS 1972, Vol. 3, pp. 147-150, containing analyses of field distribution with spaced electrodes on PLZT wafers.

Despite such prior work, no comment on the subject of electrode and light gate degradation was apparent, and it appears that such a problem either was ignored or not even recognized by the prior art.

SUMMARY OF TME INVENTION

It is a general object of this invention to overcome the disadvantages and meet the needs expressed or implicit in the above disclosure statement or in other parts hereof.

It is a related object of this invention to provide improved electrooptical systems.

It is a germane object of this invention to provide improved electrooptical information processing, display, recording, writing and reading systems.

It is also an object of this invention to provide improved electrooptical light gating methods and apparatus.

It is a related object of this invention to increase attainable gate density and to inhibit crosstalk or spurious cross-energization between light gates in electrooptical systems.

It is also an object of this invention to reduce or inhibit photoinduced birefringence in electrooptical light gate structures.

It is also an object of this invention to inhibit or reduce degradation of electrodes, light gates and light gating performance in electrooptical light gate structures.

Other objects will become apparent in the further course of this disclosure.

From a first aspect thereof, the subject invention resides in electrooptical light gating methods and apparatus comprising, in combination, the steps of, or means for, providing pluralities of light gates by means of opaque electrodes spaced for operation of said light gates between said electrodes in a transverse birefringent mode, dividing these pluralities of light gates into distinct groups each extending along a light gate structure, staggering the light gates in at least one of the groups relative to the light gates in at least another of the groups, and blocking light from each of the groups from penetrating regions of the light gate structure located transversely of light gate in any other of the groups.

From another aspect thereof, the subject invention resides in methods and apparatus inhibiting spurious cross-energization between light gates of an elongate electrooptical light gate structure. The invention according to this aspect resides, more specifically, in the improvement comprising, in combination, the steps of, or means for, providing along an elongate first region of the light gate structure a series of spaced first opaque electrodes extending transversely of the elongate first region for operating first light gates therebetween in a transverse birefringent mode, providing along an elongate second region, spaced from the first region by a third region of the light gate structure, a series of spaced second opaque electrodes extending transversely of the elongate second region for operating second light gates therebetween in a transverse birefringent mode, staggering the second electrodes relative to the first electrodes, maintaining the first electrodes away from the second region and away from said second electrodes, and maintaining the second electrodes away from the first region and away from said first electrodes.

From another aspect thereof, the subject invention resides in methods and apparatus inhibiting spurious cross-energization between light gates of an elongate electrooptical light gate structure. The invention according to this aspect resides, more specifically, in the improvement comprising, in combination, the steps of, or means for, providing along an elongate first region of the light gate structure a series of spaced first opaque electrodes extending transversely of the elongate first region, providing along an elongate second region adjacent the first region of the light gate structure a series of spaced second opaque electrodes extending transversely of the elongate second region, staggering the second electrodes relative to the first electrodes, interdigitating with the spaced first electrodes spaced third electrodes extending transversely of the elongate first region for providing first light gates between said first and third electrodes operating in a transverse birefringent mode, interdigitating with the spaced second electrodes spaced fourth electrodes extending transversely of the elongate second region, for providing second light gates between the second and fourth electrodes operating in a transverse birefringent mode, staggering the fourth electrodes relative to the third electrodes and interconnecting the first and second electrodes with a conductor extending between and along the elongate first and second regions.

From another aspect thereof, the subject invention resides in apparatus and methods for providing an elongate light gate structure of a plurality of individual chips including electrooptically active light gate material displaying field induced birefringence. The invention according to this aspect resides more specifically, in the improvement comprising, in combination the steps of, or means for providing said chips in rectangular configuration, providing on each chip a plurality of alternating electrodes on only one side of said light gate regions extending parallel to opposite sides of the rectangular chip, providing a rigid beam with a pair of spaced parallel elongate mounting surfaces and an elongate opening located between and extending along said mounting surfaces, mounting said chips side by side on said pair of mounting surfaces, with said light gate regions registering with said opening, electrically driving said light gate regions via said electrodes, and minimizing a photoinduced birefringence by shining light through said driven light gate regions from a side of said light gate material located opposite said one side.

From a further aspect thereof, the subject invention resides in an electrooptical gating method, comprising, in combination, the steps of providing a chip including electrooptically active light gate material displaying field induced and photoinduced birefringence, providing on said chip a plurality of alternating electrodes and elongate light gate regions by spacing said electrodes from each other by an interelectrode distance smaller than one-half the thickness of said electrooptically active light gate material and by distributing said electrodes over only one side of said light gate material, electrically driving said light gate regions via said electrodes, and minimizing photoinduced birefringence by shining light through said driven light gate regions from a side of said light gate material located opposite said one side.

From another aspect thereof, the subject invention resides in apparatus or methods for providing an electrooptical light gate structure, comprising, in combination, the steps of, or means for providing a layer of electrooptical light gate material, providing on said layer a plurality of alternating electrodes and light gate regions, with each electrode and each light gate region being given a length several times larger than its width and the lengths of said electrodes and of said light gate regions extending parallel to each other, and with said electrodes including interdigitated first and second electrodes having complementary corner regions, making said light gate regions individually narrower than said electrodes by spacing each adjacent two of said electrodes by a distance smaller than the width of each electrode of said two, and spacing first and second electrodes at any complementary corner region by said smaller distance.

From a further aspect thereof, the subject invention resides in an electrooptical light gating method, comprising, in combination, the steps of providing a layer of electrooptical light gate material subject to field induced and photoinduced birefringence, providing on said layer a plurality of alternating electrodes and light gate regions, with each electrode and each light gate region being given a length several times larger than its width, all of said electrodes being arranged on only one side of said layer of electrooptical light gate material, and the lengths of said electrodes and of said light gate regions extending parallel to each other, making said light gate regions individually narrower than said electrodes by spacing each adjacent two of said electrodes by a distance smaller than the width of each electrode of said two, electrically driving said light gate regions via said electrodes, and minimizing photoinduced birefringence by shining light through said driven light gate regions from a side of said layer of electrooptical light gate material opposite said one side thereof.

Other aspects of the invention will become apparent in the further course of this disclosure, and no limitation to any method, apparatus, device, element, combination, feature, scope or utility is intended by the subject summary of the invention.

BRIEF DESCRIPTION OF THE DRAWINGS

The subject invention and its various objects and aspects will become more readily apparent from the following detailed description of preferred embodiments thereof, illustrated by way of example in the accompanying drawings, in which like reference numerals designate like or functionally equivalent parts, and in which:

FIG. 1 is an elevation of an electrooptical light gate structure according to a preferred embodiment of the subject invention, together with a schematic of gate driving apparatus;

FIG. 2 is a modified side view of the gate structure of FIG. 1, including added features according to a further embodiment of the subject invention;

FIG. 3 is a partially diagrammatic showing of an information recording apparatus according to an embodiment of the subject invention;

FIG. 4 is a partially diagrammatic showing of an information recording apparatus according to a further embodiment of the subject invention;

DESCRIPTION OF PREFERRED EMBODIMENTS

Figure 6:
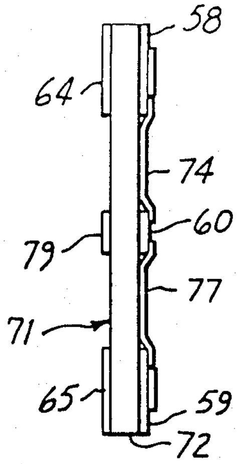
FIG. 6 is a modified side view of the gate structure of FIG. 5, including added features according to a further embodiment of the subject invention.

The light gate structure 21 of the electrooptical light gating apparatus 22 has a substrate or wafer 23 of electrooptical light gate material. Suitable light gate materials have been described in the above mentioned technical and patent literature herewith incorporated by reference herein. A particularly suitable material is the above mentioned PLZT light gate material.

The preferred embodiment illustrated in FIG. 1 provides along an elongate first region 24 of the light gate structure 21 a series of spaced first electrodes 25 extending across or transversely of the elongate first region 24. That preferred embodiment also provides along an elongate section region 26, adjacent the first region 24 of the light gate structure 21, a series of spaced second electrodes 27 extending across or transversely of the elongate second region 26.

According to the invention, the second electrodes 27 are staggered relative to the first electrode 25.

The preferred embodiment shown in FIG. 1 further interdigitates with the spaced first electrodes 25, spaced third electrodes 28 extending transversely of the elongate first region 24 for providing first light gates 34 between the first and third electrodes 25 and 28. This embodiment further interdigitates with the spaced second electrodes 27, spaced fourth electrodes 29 extending transversely of the elongate second region 26 of the light gate structure 21 for providing second light gates 35 between the second and fourth electrodes 27 and 29.

The illustrated preferred embodiment of the invention also staggers the fourth electrodes 29 relative to the third electrodes 28, as shown in FIG. 1.

Figure 8:
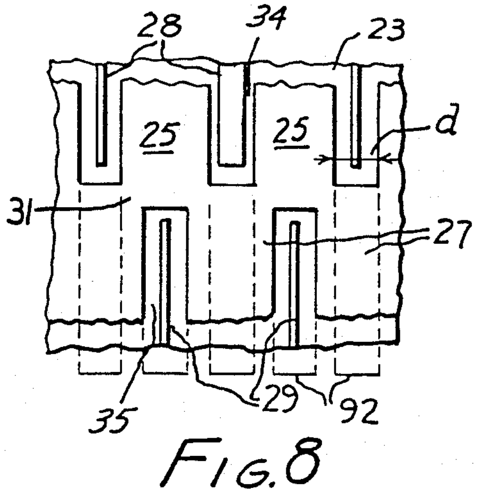
FIG. 8 is a detail view, on an enlarged scale, of a modification of the light gate structure shown in FIG. 1, according to an embodiment of the subject invention.
Figure 9:
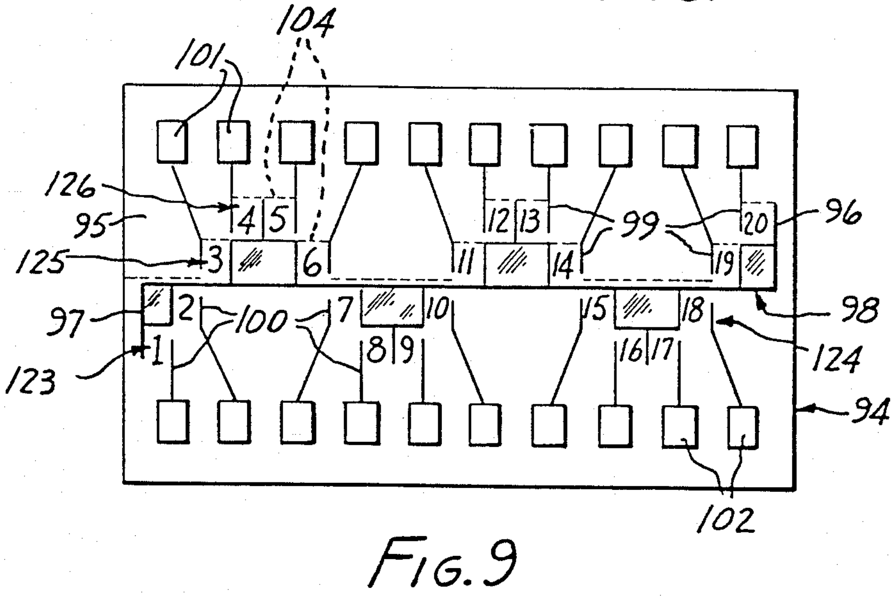
FIG. 9 is an elevation of an electrooptical light gate structure according to a further embodiment of the subject invention.

If desired, the first and second electrodes 25 and 27 may be interconnected along the elongate first and second regions 24 and 26. To this end, a common electrode or conductor 31 may be employed. As seen, for instance, at 31 in FIG. 1, and at 98 in FIG. 9, the conductor just mentioned extends between and along the elongate first and second regions, such as the regions 24 and 26 of FIGS. 1 or 8, or their equivalents in FIG. 9, for interconnecting first and second electrodes, such as the electrodes 25 and 27 of FIGS. 1 and 8, or the alternating first and second electrodes 96 and 97 of FIG. 9. The light gate structures 21 and 94 thus include the conductor just mentioned as extending between and along the elongate first and second regions for interconnecting the mentioned first and second electrodes, such as shown in FIGS. 1, 8 and 9 by way of example. In practice, the first and second electrodes 25 and 27 and the common conductor 31 may be deposited or otherwise provided on or in the substrate 23 as an integral electrode structure 32 forming a structured common or ground electrode of a dual aperture light gate arrangement, having light gates 34 and 35 divided into distinct groups 36 and 37, each extending along the elongate light gate structure 21 in its regions 24 and 26, respectively.

According to the invention, the light gates in the groups 36 and 37 are staggered relative to each other.

In a practical application, such as illustrated in FIG. 3, the light gate structure 21 may be placed between crossed polarizers with polarization axes extending at 45° angles with respect to the electrodes 25, 27, 28 and 29. According to conventional practice, the crossed polarizers typically include a polarizer plate 41 and an analyzer plate 42, having the light gate structure 21 positioned therebetween.

In a typical application, the light gate structure, now equipped with the crossed polarizers 41 and 42, is exposed to light 43 which is preferably of a collimated type, emitted by an appropriate light source 44. Suitable collimated light sources are, for example, apparent from the subject assignee's German Patent Publication 28 09 997, published Sept. 21, 1978, and British Patent Application No. 2 050 638, published Jan. 7, 1981, which also show oscillograph, facsimile and other apparatus in which the subject invention and its various aspects and embodiments may be used.

The light gates 34 and 35 operate in a transverse birefringent mode. If an electric field is applied to any individual gate or group of gates, a field induced birefringence in the ferroelectric ceramic material 23 of the light gates will cause collimated light 43 from the source 44 to pass through such activated gates. On the other hand, in the absence of an applied electric field, the crossed polarizers 41 and 42 and the unergized gates ideally block passage of light through the light gate structure.

The principle just discussed can, for instance, be used for information display, recording, writing, reading and similar purposes, including those disclosed in the above mentioned literature.

As shown in FIG. 3, light transversing the gate structure 21 and analyzer 42 may be focused or imaged onto a surface 46. By way of example, if the objective is reading of information, gated light may be focused onto a master record at 46 containing information to be read electronically, such as by means of a photocell (not shown). Conversely, if the objective is to record information, the surface 46 may be the surface of an oscillograph paper or other light sensitive medium 47 which may be presented to the energized light gate structure and may be continuously or intermittently advanced via a roller or platen 48.

In the embodiment shown in FIG. 3, a cylinder lens 49 is arranged between the light gate structure 21 or analyzer 42 on the one hand and the imaging surface 46 on the other, in order to focus gated light onto such surface. Such an arrangement, known per se, has the advantage of being largely immune to defocusing through changes in refractive index in the light gate material 23 due to the applied electric fields.

Where refractive index changes are not an inhibiting factor, the arrangement shown in FIG. 4 may be employed. In that case, the cylinder lens 49 or an equivalent imaging device focuses the light to which the light gate structure 21 is exposed. In FIG. 4, the lens 49 is thus arranged between the light source 44 and the light gate structure 21 or polarizer 41.

The advantage of the system shown in FIG. 4, known per se, is that the light gate structure 21 with crossed polarizers 41 and 42 may be made smaller and positioned closer to the imaging surface 46 or recording medium 47.

In summary, the configuration shown in FIG. 4 permits smaller gates but appears to be more sensitive to light induced birefringence and degradation in light transmission, including defocusing through change in refractive index in the light gating material. On the other hand, the arrangement shown in FIG. 3 appears less sensitive to the latter effects, but typically requires longer light gates with resulting higher capacitance of the gate structure.

In an ideal system, the width of a recorded or gated dot or line would correspond only to the geometric width of the optical gates of the gating structure 21. In practical applications, factors such as insufficient light collimation, scattering of the light in the light gate material 23, and diffraction of the light at narrow gates 34 and 35, and crosstalk between neighboring gates, detract from this ideal.

In practice, some of the mentioned degrading factors can be alleviated by improved collimation of the light 43. Crosstalk, on the other hand, is generally attributed to capacitive coupling between neighboring gates and up to now has been thought to have an inevitable limiting effect on attainable resolution and gate density.

The high dielectric constant of most electrooptically active light gate materials, such as typically 5000 to 6000 for PLZT materials, is a significant contributing factor. In addition, piezoelectric properties of PLZT and other light gate materials introduce stresses during activation of light gates which contribute to crosstalk therebetween. The higher the gate density, the more severe crosstalk can be expected in prior-art devices.

The staggered light gate and electrode configurations of the subject invention substantially reduce and in some instances practically eliminate crosstalk between light gates, including crosstalk attributable to capacitive coupling and crosstalk resulting from piezoelectric properties of, or stresses in, the light gate material.

In this respect, FIG. 1 shows a gate driver apparatus 51 for driving the plurality of gates 34 in the first group 36 individually via a like plurality of leads 52 and for driving the plurality of gates 35 in the group 37 via a plurality of leads 53, with a grounded lead 54 being connected to the common conductor 31 or electrode structure 32 and being thus common to both groups 36 and 37.

The gate drivers in the apparatus 51 may be of a type known per se. For instance, reference may be had to the assignee's above mentioned German Patent Publication No. 28 09 997 and to the assignee's British Patent Specification No. 2 050 638, published Jan. 7, 1981.

Terminal means, including individual terminals or pads 55 and 56, are provided on or at the light gate structure 21 for the energization of the individual electrodes 28 and 29, respectively.

As indicated above, crosstalk in the sense of the word herein employed involves a spurious cross-energization between light gates which manifests itself by a partial opening of one or more gates located next to an activated gate. In practice, such crosstalk severely reduces the contrast ratio between neighboring ON and OFF gates, thereby nullifying to a large extent any increase in gate density and even rendering an achievement of higher gate densities practically impossible. For instance, if the contrast ratio in electrooptical gate configurations having a density of about 100 gates per inch is from 30 to 35 dB between the ON and OFF state when all the gates are switched simultaneously, a contrast ratio of only about 10 to 20 dB is typically possible between neighboring ON and OFF gates of the same configuration. Reference may in this respect also be had to the above mentioned results of tests expressing crosstalk effects in terms of undesired light transmission by neighboring gates.

In this respect, tests on the configuration shown in FIG. 1 have shown very substantial improvements in crosstalk inhibition, resulting in some instances in an abolition of crosstalk, as presently set forth.

In this respect, the light gate 34 at the extreme right in the group 36 may be viewed as a reference gate which is opened by one of the gate drivers in the apparatus 51. The light gate 35 at the extreme right of the group 37 may then be considered as the next or first adjacent gate. In addition, the light gate 34 next in line to the left of reference gate in group 36 may be considered the second adjacent gate.

Moreover, the light gate 35 next in line to the left of the extreme right gate in group 37 may be considered as the third neighboring gate. Furthermore, the light gate 34 second in line to the left from the extreme right light gate 34 in group 36 may be considered as the fourth neighboring gate.

With this reference system in mind, it has been found with a 256 gate per inch structure according to FIG. 1 that there is zero crosstalk in the first and third neighboring gates. Light transmission through crosstalk, moreover, was only about an eightieth in the second neighboring gate relative to the amount of desired light transmission in the switched first gate. Spurious light transmission in the fourth gate was only a negligible twohundredfiftieth of the desired light transmission in the first switched gate.

These illustrative values should indicate the extent and nature of the crosstalk inhibition achievable by the subject invention.

Further improvements are realized within the scope of the invention by combination of different features. For instance, the above mentioned feature of locating terminal means on dielectric layers having a dielectric constant lower than that of the light gate material may be employed in conjunction with the staggering of light gates and electrodes according to the subject invention.

In this respect, FIG. 2 shows an application of dielectric strips or layers 58 and 59 to the light gating material 23. Since the dielectric layers 58 and 59 are optional, their possible presence has been indicated in FIG. 1 only by dotted lines 61 and 62 indicating representative edges of the dielectric strips 58 and 59, respectively, at the light gate regions.

The embodiment illustrated in FIG. 2 provides the light gates 34 and 35 with a predetermined electrooptically light gate material 23 having a dielectric constant which, for instance, may be as high as 5000 to 7000 in the case of PLZT material. The embodiment presently under discussion further provides the light gate structure 21 outside of the light gates 34 at the elongate first region 24 with a first dielectric layer 58 having a dielectric constant lower than the dielectric constant of the electrooptically active light gate material. Similarly, the light gate structure outside of the light gates 35 at the elongate second region 26 is provided with a second dielectric layer 59 having a dielectric constant lower than the dielectric constant of the electrooptically active light gate material 23.

Several low-dielectric-constant materials are suitable for the layers 58 and 59, with silicon monoxide and silicon dioxide being presently preferred.

The embodiment presently under discussion then provides the third electrodes 28 with first terminal means 55 on the first dielectric layer 58, and the fourth electrodes 29 with second terminal means 56 on the second dielectric layer.

Taking the above mentioned staggered electrode structure according to FIG. 1 with a density of 256 gates per inch as an example, it was determined that, with the addition of the dielectric layers 58 and 59, the crosstalk light transmission in the second neighboring gate was reduced from an eightieth to a twohundredfiftieth of the desired light transmission in the switched reference gate.

Moreover, crosstalk light transmission in the fourth neighboring gate was only a threehundredth of the switched light transmission in the reference gate. Again, the crosstalk light transmission was zero in the first and third neighboring gates. No stress crosstalk was considered in these tests.

Another feature resulting in a material reduction of overall crosstalk light transmission resides in a permanent blocking of light transmission through selected portions of the light gate material. The expression "permanent blocking" is herein employed to designate a blocking of light transmission or penetration that is different from the temporary blocking effected by unenergized or insufficiently biased gates, which transmit light upon application of a sufficient electric field.

In this respect, FIG. 2, by way of example, shows two strips 64 and 65 of opaque material applied to the dielectric material 23. Dotted lines 61 and 62 in FIG. 1, previously employed in connection with the description of the dielectric layers 58 and 59, may now be considered as designating the extent of the opaque strips 64 and 65. These strips are employed for blocking light from penetrating the light gate structure 21 at the terminal means 55 and 56. In practice, the opaque strips 64 and 65 may be employed in addition to the dielectric strips 58 and 59, for a still further reduction of crosstalk light transmission.

On the other hand, the opaque strips 64 and 65 or similar light masking means may be employed without the dielectric strips 58 and 59. In that case, the third electrodes 28 would be provided with first terminal means 55 at the elongate first region 24, and the fourth electrodes 29 with second terminal means 56 at the elongate second region, with light then being permanently blocked from penetrating the light gate structure 21 at the first terminal means 55 and at the second terminal means 56. Strips or a layer of opaque material may extend to this effect along the first and second elongate regions 24 and 26 outside of the light gates 34 and 35.

As shown with the aid of FIG. 3, an embodiment of the subject invention, which exposes the light gate structure 21, equipped with crossed polarizers 41 and 42, to the collimated light 43, selectively energizes the first and third electrodes 25 and 28 for gating light 66 through selected portions of the first region 24, and selectively energizes the second and fourth electrodes 27 and 29 for gating light 67 through selected portions of the second region. According to the embodiment of the invention illustrated with the aid of FIG. 3, the cylinder lens 49 or another optical means is then employed for imaging the gated light 66 from the first region 24 and the gated light 67 from the second region 26 onto an elongate image area 68 common to the first and second regions 24 and 26. For instance, in the example given in FIG. 3, such common elongate image area 68 may be a line extending across the surface 46 of the recording medium 47 in parallel to the axis of rotation 69 of the roller 48.

Alternatively, the gated light 66 and the gated light 67 may be imaged on different areas of a surface. This may, for instance, be advantageous in practice for display or alphanumeric character generating purposes. However, the embodiment illustrated with the aid of FIG. 3, in which gated light from different gating areas is imaged onto a image area common to two or more gating areas, is generally preferred for recording, reading and facsimile transmission purposes.

This particularly in view of the zero crosstalk feature with respect to odd-numbered neighboring gates in the staggered light gate structures of the subject invention.

Figure 5:
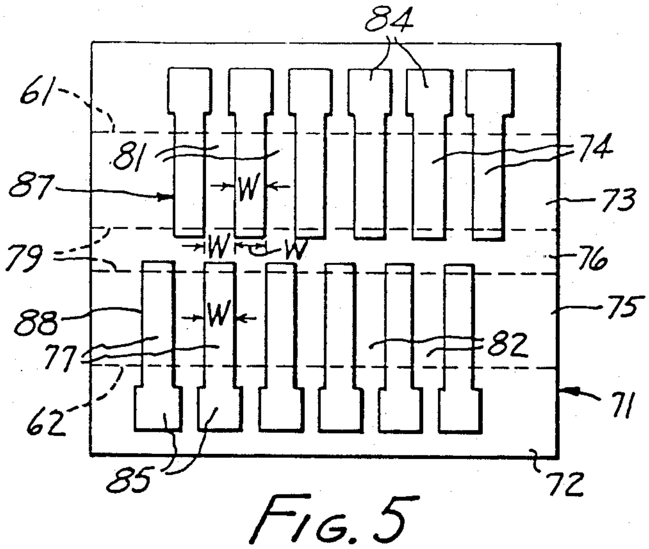
FIG. 5 is an elevation of an electrooptical light gate structure according to a further preferred embodiment of the subject invention.

As illustrated with the aid of FIGS. 5 and 6, the gate and electrode staggering concepts of the subject invention are also applicable to single aperture gate configurations.

By way of example, the light gate structure 71 of FIG. 5 again has a chip or substrate 72 of electrooptically active light gate material which, for example, may be of the PLZT type. The second preferred embodiment illustrated in FIG. 5 provides along an elongate first region 73 of the light gate structure or substrate a series of spaced first electrodes 74 extending transversely of the elongate first region 73. Similarly, the illustrated preferred embodiment provides along an elongate second region 75, which is spaced from the first region 73 by a third region 76 of the light gate structure, a series of spaced second electrodes 77 extending transversely of the elongate second region 75.

According to the subject invention, the second electrodes 77 are staggered relative to the first electrode 74. Also, the first electrodes 74 are maintained away from the second region 75, and the second electrodes 77 similarly are maintained away from the first region 73. In other words, the first electrodes 74 do not extend into the second region 75, but rather are segregated therefrom. Similarly, the second electrodes 77 do not extend into the first region 73, but are also segregated therefrom.

According to an optional feature of the currently discussed embodiment, light may be permanently blocked from penetrating the third region 76 of the light gate structure 71. For instance, and as shown in FIG. 6 and by two dotted lines in FIG. 5, a layer or strip 79 of opaque material may be extended along or in parallel to the third elongate region 76. This, in practice, inhibits spurious light transmissions between electrodes 74 and 77.

First light gates 81 are provided by and between the first electrode 74, and second light gates 82 are provided and between the second electrodes 77, as shown in FIG. 5.

As before, there may be provided on the light gate structure 71 outside of light gates 81 and 82 at either or both the elongate first and second regions 73 and 75 one or more dielectric layers 58 and 59 having a dielectric constant lower than the dielectric constant of the electrooptically active light material 72. Also, such a low-dielectric-constant layer may be provided between the first and second electrodes 74 and 77 and light gates 81 and 82, respectively, to avoid crosstalk therebetween. As seen in FIG. 6, such dielectric layer 60 may, for instance, be deposited on the substrate 72, and may extend along the third region 76.

The first electrodes 74 have individual terminals or terminal means 84 on the dielectric layer 58, and the second electrodes 77 have individual terminals or terminal means 85 on the second dielectric layer 59, if present.

Opaque masks or strips 64 and 65 may again be employed as seen in FIG. 6 and as indicated by dotted lines 61 and 62 in FIG. 5, for permanently blocking light from penetrating the light gate structure at the terminal means 84 and 85. The opaque masks 64 and 65 and, if desired, the opaque mask 79, may be employed with or without the dielectric layers 58 and 59, the objective again being in either case to block spurious light transmissions.

The arrangements shown in FIGS. 3 and 4, or other crossed polarizer, collimated light source and lens systems may be employed for exposing the light gate structure 71 to light.

In similarity to the apparatus indicated at 51 in FIG. 1, known gate drivers may be employed for selectively energizing the single aperture gates 81 and 82. Reference may in this respect be had to the above mentioned 1973 WESCON paper, particularly to pages 9 and 10 thereof. Reference may also be had to the assignee's British Patent Specification No. 2 050 638 published Jan. 7, 1981, and disclosing single gate drivers.

The latter patent specification or patent may also be referred to for light gate chip mounting structures and techniques which may be employed in connection with the light gate structures herein disclosed.

As before, light penetrating gates 81 and 82 in the first and second regions 73 and 75 of the light gate structure 71 may be imaged on different areas or preferably, according to the principles shown in FIGS. 3 and 4, may be imaged on an elongate area or line 68 common to both regions 73 and 75.

With the single gate configuration of FIGS. 5 and 6, crosstalk or spurious light transmission is considerably reduced and, between gates of different groups 87 and 88 is practically eliminated.

Different embodiments of the subject invention handle the matter of electrode and gate widths differently. For instance, each of the first electrodes 25 or 74 may be given a predetermined width w, and each adjacent two of the second electrodes 27 or 77 may be spaced by a distance equal to that width.

Also according to an embodiment of the subject invention, each of the second electrodes 27 or 77 may be given a predetermined second electrode width, and each adjacent two of the first electrodes 25 or 74 may be spaced by a distance equal to that second electrode width.

According to a further embodiment of the subject invention more specifically illustrated in FIGS. 1 and 5, each of the first electrodes 25 or 74 and each of the second electrodes 27 or 77 may be given a predetermined width w, and each adjacent two of the first electrodes 25 or 74 and each adjacent two of the second electrodes 27 or 77 may be spaced by a distance equal to that width w. In practice, this enables an imaging, recording or reading system in which adjacent gated light elements may be presented without intervening interruption.

In some applications, such as alphanumeric character generation or in instances where recording or presentation in a raster is desired, it may be preferable to provide distinct gaps between the presentation of adjacent gated light elements. In that case, the technique shown in FIG. 7 may be applied to the light gate structure 71 of FIG. 5, and the light gate structure 21 of FIG. 1 may be subjected to the technique illustrated in FIG. 8.

Figure 7:
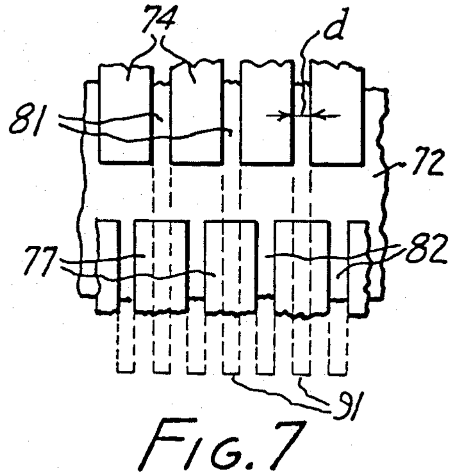
FIG. 7 is a detail view, on an enlarged scale, of a modification of the light gate structure shown in FIG. 5, according to an embodiment of the subject invention.

In particular, according to FIGS. 7 and 8, the first electrodes 25 or 74 are spaced from each other by a distance d smaller than a width of the second electrodes 27 or 77, while such second electrodes are spaced from each other by a distance smaller than a width of the first electrodes. This, in turn, provides light gates 34 and 35 or 81 and 82 which are narrower than the width of the corresponding electrodes. As somewhat diagrammatically illustrated at 91 in FIG. 7 and 92 in FIG. 8, a raster system is thus provided in which the gated light elements are projected and, if desired, displayed and recorded. As shown in the middle of FIG. 8, either of the electrodes 25 and 28 may be wider than the gap or light gate therebetween.

FIG. 9 shows a light gate structure 94 according to an embodiment which expands on the principle illustrated in FIG. 1. According to FIG. 9, twenty gates designated by reference numerals 1 through 20, are realized on a substrate or chip 95 of electrooptically active light gate material. The alternating first and second electrodes 96 and 97 of an electrode structure 98 common to the gates 1 to 20 are clearly apparent in FIG. 9, as are the individual third and fourth electrodes 99 and 100, respectively, with their terminal means or pads 101 and 102.

The imaging, focusing, masking and dielectric constant reducing techniques so far discussed may also be applied to the quatruple-type electrode structure 94 of FIG. 9. In this respect, and by way of example, a stepped dotted line 104 in FIG. 9 indicates the lower fringes of a light mask with which the penetration of light between terminals 101 and leads to individual electrodes may be inhibited. A similar masking technique may, of course, be applied to the lower part of the light gate structure 94 shown in FIG. 9.

Figure 10:
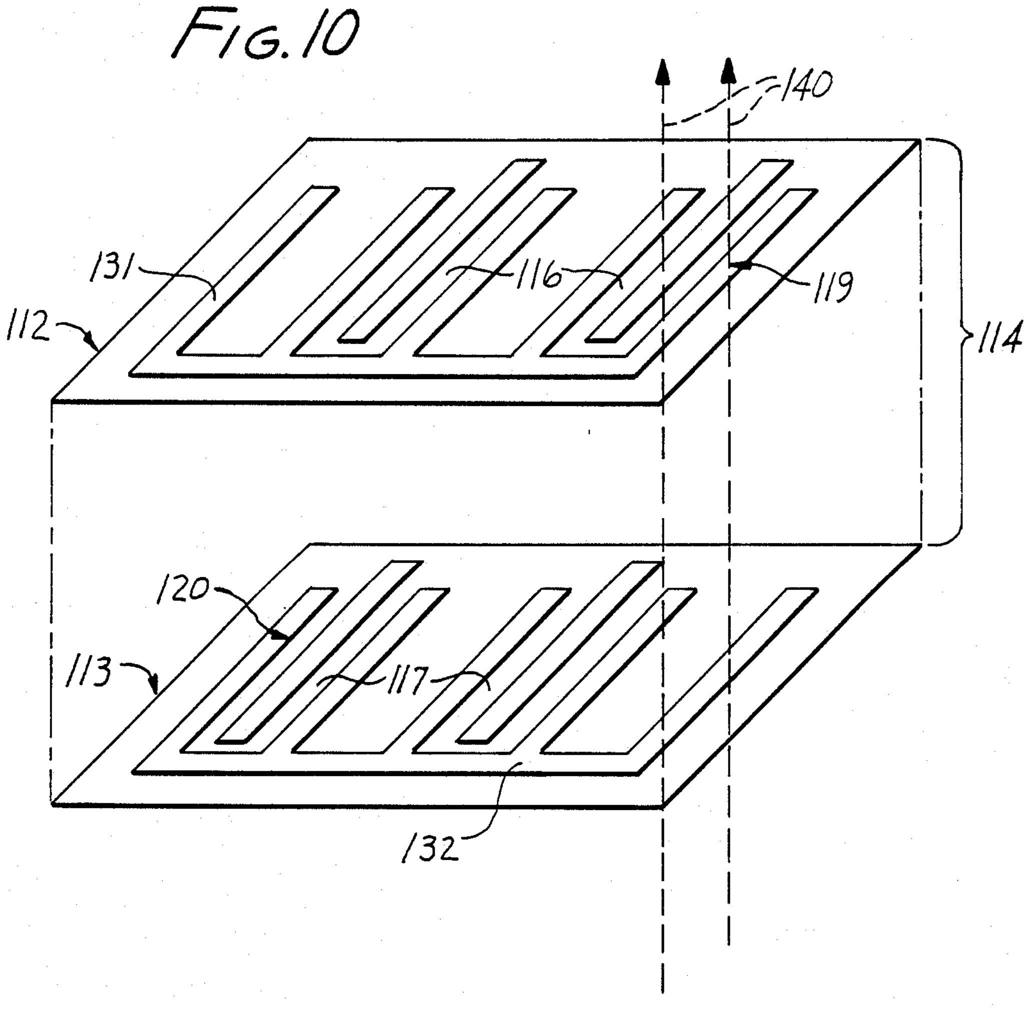
FIG. 10 is an exploded view of a composite light gate structure according to a further embodiment of the subject invention.

In the exploded view of FIG. 10, two electrode structures 112 and 113 are shown which, superimposed, form a composite electrode structure 114.

It may be well to recognize at this juncture that the various light gate and electrode structures herein disclosed follow a common principle according to the subject invention. This principle, apparent, for instance, from FIGS. 1, 5 and 10 divides pluralities of light gates 34 and 35, 81 and 82, or 116 and 117 into distinct groups 36 and 37, 87 and 88, or 119 and 120, each extending along a light gate structure 21, 71, 112 or 113. The same may be said with respect to the light gate structure 94 shown in FIG. 9, in which pluralities of light gates 1 to 20 are divided into distinct groups 123, 124, 125 and 126, with the light gates in at least one of these groups being staggered relative to the light gates in at least another of these groups 123 to 126. In the case of the specific embodiment illustrated in FIG. 9, the light gates of any of the groups 123 to 126 are staggered relative to the light gates of any other of these groups. In other words, the light gates of all of the groups 123 to 126 are staggered relative to the light gates of all other groups.

In the embodiments shown, by way of example, in FIGS. 1, 5 and 10, the light gates 34 and 35, 81 and 82, or 116 and 117 are arranged in two distinct groups 36 and 37, 87 and 88, or 119 and 120, each extending along a light gate structure 21, 71 or 112 or 113 of the composite light gate structure 114. Light gates in one or either of the groups 36 and 37, 87 and 88, or 119 or 120 are staggered relative to light gates in the other of these groups.

In the embodiment shown, by way of example, in FIGS. 1 and 5, at least two of the groups, such as the groups 36 and 37 or 87 and 88 are arranged on the same light gate structure 21 or 71, and light gates in one of these two groups are staggered relative to light gates in the other of these two groups 36 and 37 or 87 and 88 on the same light gate structure 21 or 71.

As an important feature of a preferred embodiment of the subject invention, means are provided for blocking in each of the groups light from penetrating regions of the light gate structure located transversely of light gates in any other staggered group. By way of example, the above mentioned dotted line 104 indicates such masking means for the upper half of the light gate structure 94, as seen in FIG. 9.

In the embodiments seen in FIGS. 1, 5, 7 and 8, the first and second electrodes 25 and 27 or 74 and 77 are opaque and are made wide enough to block in each of the groups 36 and 37 or 87 and 88 light from penetrating light gate regions 24 and 26 or 73 and 75 located transversely of, or across from, light gates in any other staggered group.

For instance, opaque electrodes 25 or 74 are wide enough to block light from penetrating regions of portions of the light gate structure located in the elongate region 24 or 73 across light gates 35 or 82.

This, in practice, still further reduces crosstalk when gated light from the two elongate regions 24 and 26 or 73 and 75 is projected onto a common image area or line 68, since the light blocking effect carried out by the opaque electrodes prevents gated light from one group 36 or 87 to interfere with gated light from the other group 37 or 88. This mutual non-interference is even more pronounced in the embodiment of FIGS. 7 and 8, where the electrodes 25 and 27 or 74 and 77 are wider than the opposite gates 35 and 34 or 82 and 81, respectively.

The composite structure shown in FIG. 10 is an example of an embodiment of the subject invention in which at least two of the groups 119 and 120 are arranged on at least two different light gate structures 112 and 113, with light gates 116 or 117 on one of the two light gate structures being staggered relative to light gates 117 or 116 on the other of the two light gate structures. Where the electrode patterns are identical in shape or configuration on the two light gate structures, the requisite staggering may be effected by shifting one electrode or light gate structure, such as the structure 113, relative to the other electrode or light gate structure, such as the structure 112, by one overall gate width, so that the gates 117 in one of the groups 120 coincide with gaps between gates 116 in the other group 119 and vice versa. The gates on each structure 112 and 113 may be distinct from each other, or—as shown in FIGS. 1, 10 and 11—may have a common ground electrode 32, 131 or 132.

Figure 11:
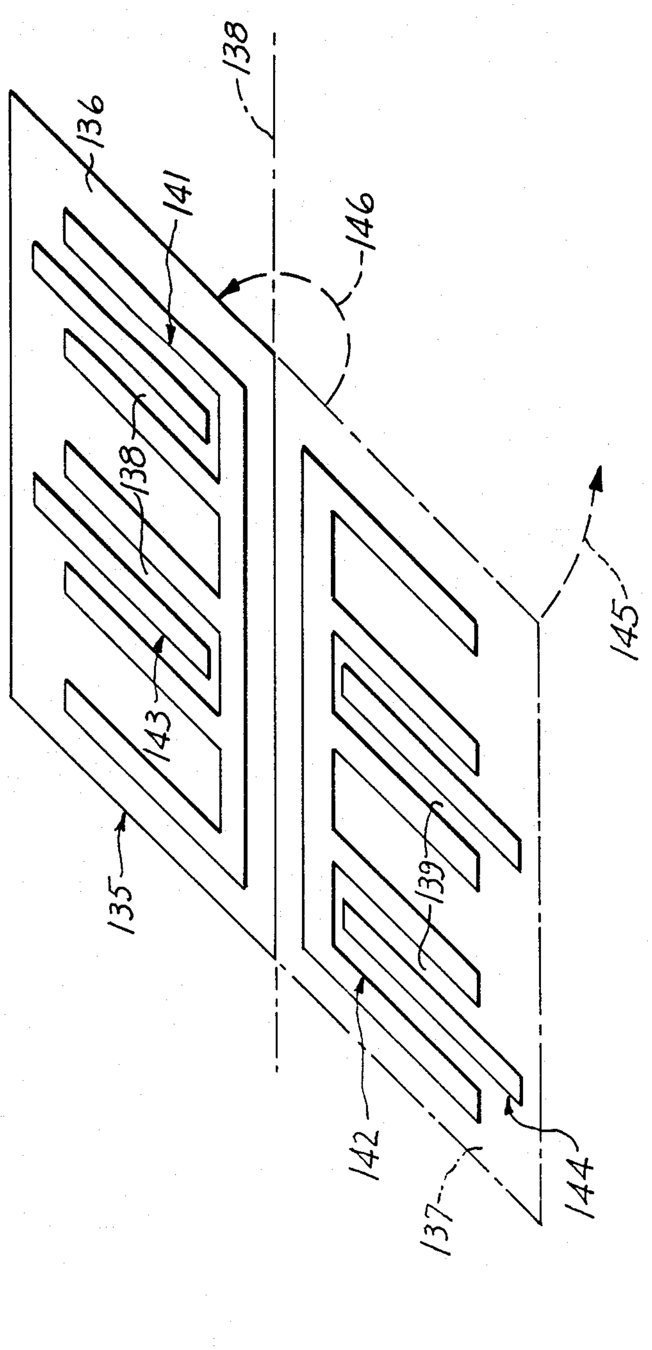
FIG. 11 is an angularly exploded view of a light gate structure that may be employed in the composite structure of FIG. 10, and, indicated with the aid of a dotted line, of a staggered light gate structure according to a further embodiment of the subject invention.

As seen in FIGS. 10 and 11, identical ground or common electrodes 131 and 132 may be employed on the two structures 112 and 113 or sides and, respectively, may be arranged in mutual coincidence or registry.

While FIG. 10 presents an exploded view, it should be understood that the different light gate structures 112 and 113 may be superimposed on each other. In fact, within the scope of the subject invention, the different electrode patterns or light gate groups may be positioned on opposite sides of the same light gate structure or electrooptical substrate. Reference may, in this respect be had to the angularly exploded showing of FIG. 11.

In particular, FIG. 11 shows a light gate structure 135 having an upper side or major plane 136 and a lower side or major plane 137. For the purpose of illustration, the lower side is shown as angularly moved about an axis 138 extending along a major side of the light gate structure 135.

The two sides 136 and 137 shown in FIG. 11 may be considered as two different regions of the light gate structure 135. In principle, these two regions 136 and 137 could be arranged adjacent each other as shown in FIG. 11. In that case, the light gate structure 136 would be akin to the light gate structure 21 shown in FIG. 1, if a dual aperture gate configuration is employed, as shown in FIG. 11, or akin to the light gate structure 71 shown in FIG. 5, if a single aperture configuration were employed instead of the illustrated dual gate aperture.

In the case of a dual aperture configuration, the presently discussed embodiment according to FIG. 11 would read on most of the definitions given for the structure of FIG. 1. Similarly, in the case of a single aperture configuration on adjacent regions 136 and 137, the embodiment according to FIG. 11 presently under discussion would read on most of the definitions herein given for the embodiment of FIG. 5.

In either case, the electrodes or electrode structures 143 and 144 would be staggered relative to each other, such as by one overall gate width, for coincidence of the gates 138 and 139 in either group with gaps between gates in the other group 141 or 142.

The electrode structure 135 would also be akin to the electrode structure 21 if the side or region 137 were angularly moved about the axis 138 as indicated by an arrow 145 in FIG. 11, so that the regions 136 and 137 would form opposite sides of one and the same electrode structure 135 or electrooptically active light wafer, as indicated by the arrow 146. In that case, light gates 138 in one of the regions 136 would be staggered relative to light gates 139 in the other region 137, such as by an overall gate width or by one-half the overall center-to-center spacing between gates 138 on the same structure or side 136. For example, electrodes 143 and light gates 138 on one side 136 of the light gate structure 135 would be staggered relative to electrodes 144 and light gates 139 on the other side 137 of the same light gate structure 135. In this respect, while the electrode structures 143 and 144 would be distinct and located either on or in opposite sides 136 and 137 of the light gate structure 135, the light gates 138 and 139 would complement each other, forming together a composite light gate structure 135. Similarly, the staggered light gates 116 and 117 in FIG. 10 form together a composite light gate structure 114.

However, where the light gates are staggered relative to each other, such as seen in FIG. 11, it appears appropriate to talk of different groups 141 and 142 of light gates 138 and 139, even though partially coincident pairs of gates 138 and 139 form composite light gates traversed by the same light. This may also be seen from FIG. 10, which could be taken as illustrating either two superimposed different light gate structures 112 and 113 or as showing in an exploded view two opposite major sides 112 and 113 of one and the same electrode structure 114. For either case, light 140 penetrates one or more opened gates 116 or 117 in either structure 112 or 113 and coincident portions of the other structure 113 or 112, respectively. Accordingly, the staggered electrode structures and light gates 116 and 117 or 138 and 139 in effect form composite light gate structures in which capacitive coupling and crosstalk between neighbors are reduced.

The principles of the subject invention are also applicable to composite light gate structures in which pairs of electrodes or light gate groups are arranged in mutual registry at opposite sides of constituent light gate structures, as will now be explained with the aid of FIG. 10. In particular, the electrodes shown at the top side of the electrode structure 112 in FIG. 10 may be duplicated at the bottom side of that structure 112 and, by way of example, may be duplicated in exact registry with such electrodes at the top side.

In the same manner, the electrodes shown at the top side of the structure 113 in FIG. 10 may be duplicated at the bottom side thereof, so that a second pair of light gate groups are arranged in mutual registry at opposite sides of the second light gate structure 113 of the composite pair 114.

In that case, the registering light gates 116 in the first pair at 112 would be staggered relative to the registering light gates 117 in the second pair at 113 as seen in FIG. 10, with a composite light gate structure 116 being again realized upon superimposition of the two double-electroded light gate structures 112 and 113. Also, where FIGS. 10 and 11 show dual aperture configuration, single aperture light gate configurations may easily be formed, such as by omitting the common comb-shaped electrodes, leaving the mutually spaced, parallel, single and individually drivable straight electrode elements.

The terminal area masking and dielectric layer techniques explained above with the aid of FIGS. 1, 2, 5, 6 and 9 may, of course, also be employed in the light gate structures of FIGS. 10 and 11.

The type of collimated light and crossed polarizer systems shown in FIGS. 3 and 4 may also be employed in connection with the embodiments of FIGS. 10 and 11, with light from two or more light gate regions being naturally projected onto the same image area, since the gates 116 and 117 or 138 and 139 are already in coincidence.

Figure 12:
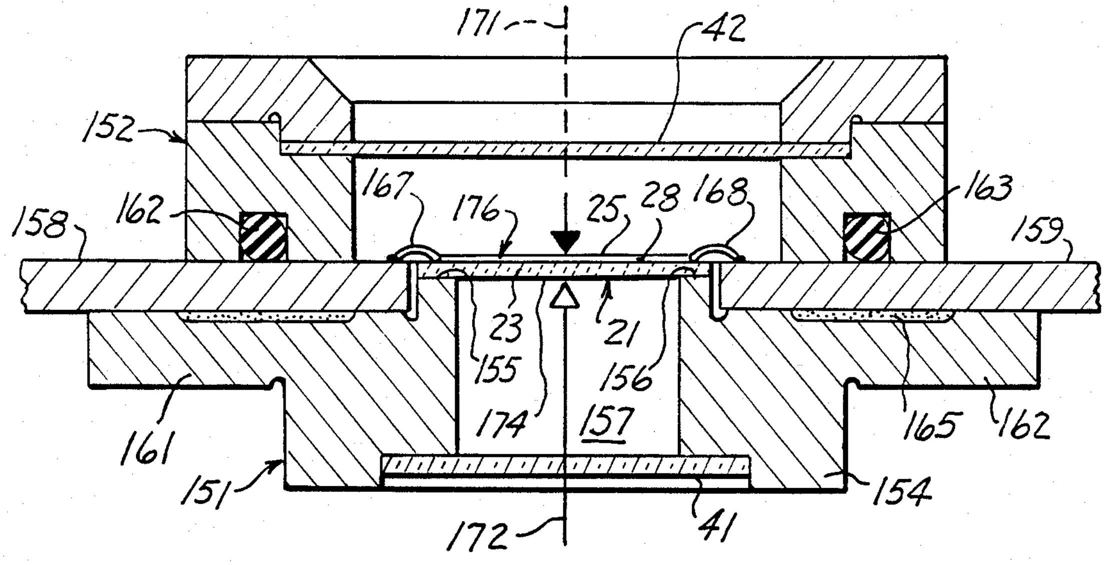
FIG. 12 is a cross-section through a supporting structure for light gate arrays and associated filters and an illustration of light gate illumination methods, according to an embodiment of the subject invention.

According to the aspect or embodiment of the invention shown in FIG. 12, the light gate structure 21, including the electrooptical light gate material 23 and interdigitated electrodes 25 and 28 and/or 27 and 29, is mounted in an elongate support 151 which preferably also supports one of the filters, such as the polarizer 41. The mounting structure may also include a frame 152 for the other filter, such as the analyzer 42. The mounting structure 21 is thus located between the polarizer 41 and analyzer 42.

The support 151 includes a rigid beam 154 with a pair of spaced parallel mounting surfaces 155 and 156 and an elongate opening 157 located between these mounting surfaces.

Circuit boards 158 and 159 may be supported on the beam 154 or lateral extensions 161 and 162 thereof, in proximity to the supported light gate structure 21. The circuit boards 158 and 159 may include circuitry for driving the light gate structure, such as the gate drivers 51 mentioned above.

Gaskets 162 and 163 may be employed to seal the unit against dust and other contaminants. Cement 165 may be employed for similar purposes. Mounting clips or wires 167 and 168 may be employed for mounting the light gate structure 21 on the pair of mounting surfaces 155 and 156, with the light gate regions on the structure 21 registering with the elongate opening 157.

If desired, the components 167 and 168 may be part of means for electrically driving the light gate regions via the electrodes 25 and 28, for instance.

The dotted line 171 in FIG. 12 indicates a conventional light path for the illumination of the light gate structure 21 from a suitable source, such as the above mentioned collimated light source 44. Such conventional light path proceeds such that the light gate structure 21 is illuminated for its light gating function through the same side on which the light gate electrodes 25 and 28 are located. In that case, the polarizer would be located at 42, while the analyzer would be situated at 41 in FIG. 12, with the recording material located below such analyzer in order to receive gated light from the structure 21.

However, according to an aspect or preferred embodiment of the subject invention, photoinduced birefringence is minimized by shining light through the driven light gate regions from a side 174 of the light gate material 23 located opposite the one side on which the electrodes 25, 28, etc., are located. In other words, all electrodes 25, 28 are arranged on only one side of the layer of electrooptical light gate material 23, and photoinduced birefringence of the light gate material or structure is minimized by shining light 172 through the driven light gate regions from a side 174 of the layer of electrooptical light gate material 23 opposite the mentioned one side thereof. In that case, 41 is the polarizer and 42 the analyzer, as shown in FIG. 12.

Figure 13:
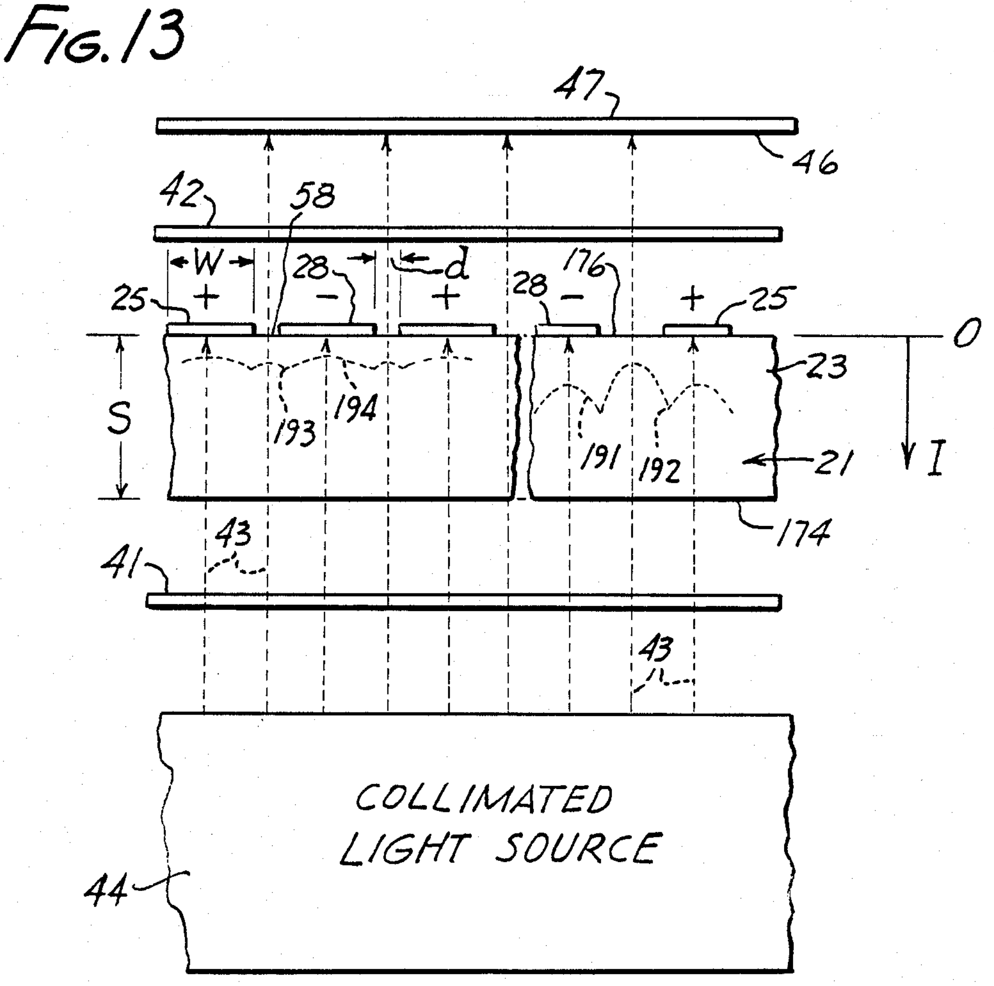
FIG. 13 is a somewhat diagrammatic side view of a light gate illumination method and improved light gate structure according to preferred embodiments of the subject invention.

Reference may now be had to FIG. 13 for a further disclosure of the currently discussed aspect of the subject invention. In both FIGS. 12 and 13, and in general, what is termed herein the side 174 and the side 176 may be the faces or major surfaces of the electrooptic layer 23.

In particular, FIG. 13 shows how a source 44 of collimated light 43 shines such light through a polarizer filter 41 and back side 174 of a substrate, chip or layer 21 of PLZT or other electrooptically active light gate material 23. In this respect, the back side 174 is the side of the substrate, chip or layer 21 or 23 which is opposite the side on which the electrodes are deposited or over which such electrodes are distributed.

Light gate structures 21 of the type herein disclosed or mentioned are vulnerable to photoinduced or light induced birefringence in high-intensity electric fields. For relative high electrode densities of the type herein contemplated, photoinduced birefringence presented a serious problem.

By way of example, in cases where the light gate structure 21 was illuminated in the manner indicated by the dotted arrow 171 in FIG. 12, it has been observed that the relative light output of the light gate structure degraded through light induced birefringence to 50% of its original value within four hours of operation. A degradation to one-third of the original light output of the solid-state light gate structure 21 was observed after seven hours of operation.

On the other hand, under identical test conditions, the relative light output was at an optimum between one and two hours of operation and never went below 80% of the maximum output within a test period of seven hours, if the layer of electrooptical material 23 or light gate structure 21 was illuminated through the back side 174 as indicated by the solid arrow 172 in FIG. 12 and as illustrated in FIG. 13.

In particular, if light is shined through the back side 174 according to the illustrated preferred embodiment shown in FIGS. 12 and 13, two effects cooperate in minimizing photoinduced birefringence. First, light is absorbed by or in the material of the layer 23 before it will reach the areas of electric field concentration near the top surface 176. Any undesirable photoexcitation is thus reduced to that extent. Also, nothing is lost by such light absorption, since light would be absorbed anyway by the material in the layer 23, whether it proceeds from the surface 174 to the surface 176 as shown in FIG. 13 or from the top surface 176 to the bottom surface 174 when illuminated as indicated by the dotted arrow 171 in FIG. 12. The preferred embodiment shown in FIGS. 12 and 13 thus accomplishes a reduction of photoinduced birefringence at a minimum light loss. Secondly, light from the source 44 entering the layer 23 through the back side 174 illuminates the regions of the layer 23 behind or below the electrodes 25, 28, etc., thereby promoting dissipation of charge carriers during OFF periods of the gates, which minimizes degradation of the light transmission. Since a longer period of time is required to dissipate charge carriers than to build up a space charge, a minimum ON to OFF ratio of each gate should be provided to prevent degradation of light transmission.

As a result, high-density gated light patterns and recordings are obtained. In particular, light gated through the material 23 proceeds via an analyzer 42 to a imaging surface 46, recording medium 47, or other light sensitive system.

The currently disclosed aspect of the subject invention thus resides in an electrooptical gating method comprising in combination the steps of providing a chip or wafer 21 including electrooptically active light gate material 23 displaying field induced and photoinduced birefringence, providing on the chip or wafer 21 a plurality of alternating electrodes 25, 28, etc., and elongate light gate regions (spaces between elongate electrodes) by spacing the electrodes from each other by an interelectrode distance smaller than one-half the thickness of the electrooptically active light gate material 23 and by distributing the electrodes over only one side 176 of the light gate material. The light gate regions are electrically driven via the electrodes 25, 28 etc., and photoinduced birefringence is minimized by shining light 43 or 172 through the driven light gate regions from a side 174 of the light gate material 23 located opposite the one side 176.

The light gate structures so far described, except those shown in FIGS. 7 and 8, may be of a type in which the ratio of individual electrode width to light gate width is equal to one or less. In other words, the spacing between each two adjacent electrodes may be equal to or larger than the width of each of the two electrodes.

Figure 14:
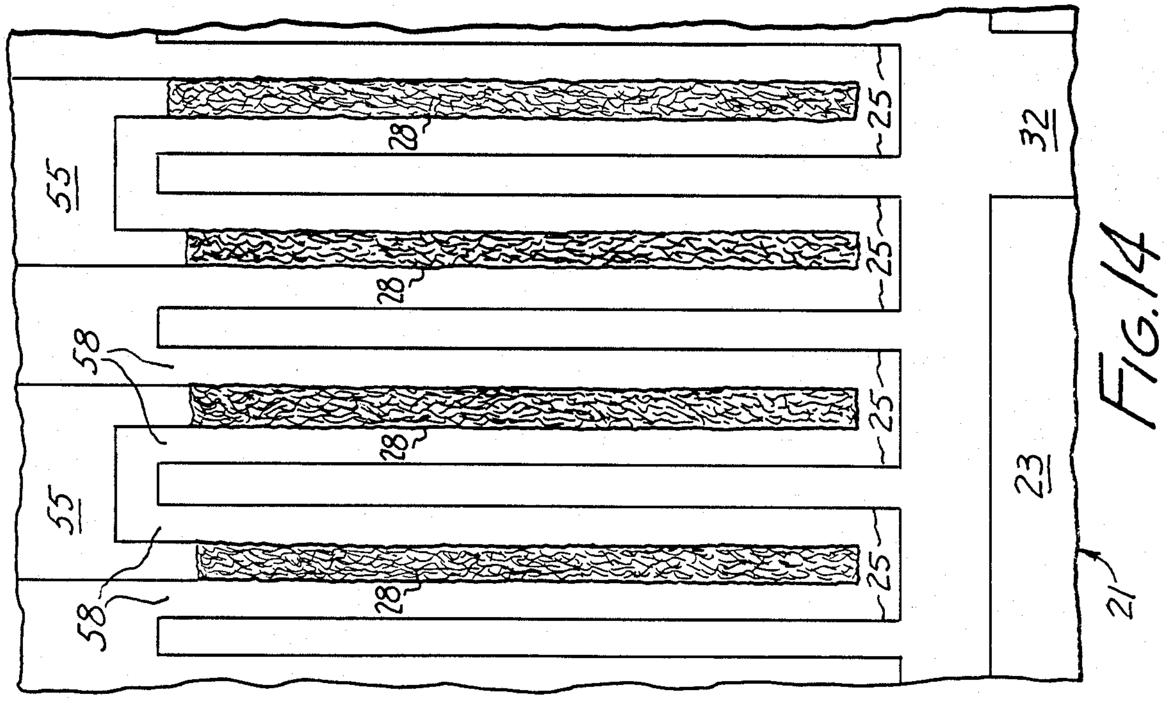
FIG. 14 is a plan detail view, on an enlarged scale, of an electrooptical light gate structure showing degradation of interdigitated electrodes.

An example of substantially equal light gate and electrode widths has been shown on an enlarged scale in FIG. 14. In particular, FIG. 14 shows a light gate structure 21 in which elongate electrodes 25 and 28 alternate and are interdigitated with each other on a layer of electrooptically active light gate material 23. In the particular example of FIG. 14, the electrodes 25 are part of a common electrode 32 which may be commonly driven. Similarly, pairs of electrodes 28 are grouped together, with each electrode pair being biased or driven via a terminal 55 common to that pair. However, the subject invention extends also to systems in which each electrode 28 is individually driven.

Each switchable light gate thus has one or more interelectrode spacings or commonly driven light gate regions 58 through which light selectively may penetrate or with which light effectively may be stopped, depending on the switched condition of the particular light gate.

In principle, the electrodes 25 and 28 and their terminals 32 and 55 preferably should be of a non-oxidizing material which readily accepts bonding of lead wires thereto. By way of example, a favored material for the electrodes and their terminals is gold. However, gold does not easily bond to PLZT and other light gate materials. Accordingly, an intermediate material, such as chromium, for instance, is first deposited on the light gate material, with gold being subsequently deposited thereon. Other materials, such as molybdenum, titanium or nickel may be used as an intermediate material.

As apparent from FIG. 14, the ratio of electrode width and gate width is about unity; that is, the width of each electrode 25 or 28 is about equal to the width of each interelectrode spacing or light gate 58. While there has been some mentionings in the past of narrower gap than electrode widths, the ratio illustrated in FIG. 14 represents the most widely used compromise between unacceptably high half-wave voltages resulting from wider gates and the apparently unacceptably high average field intensities attributed to narrower gates on the basis of the formula for polarization of quadratic electrooptical materials, modified to take into account the effective field penetration, with attendant photoinduced birefringence phenomena and light transmission losses.

Against this background, FIG. 14 shows the effects of an unexpected phenomenon occurring during the driving of electrooptical gates for prolonged periods of time, especially under conditions of increased humidity.

In particular, FIG. 14 shows an example of an ongoing electrode degradation stemming from a material transport phenomenon. By way of example, FIG. 14 has been drawn to depict degradation of an electrode structure produced by sputtering chromium on a layer 23 of PLZT light gate material, then sputtering gold onto the sputtered chromium layer, and applying conventional photolithography and etching techniques for producing the patterns of electrodes 25 and 28. This electrode structure was cycled with a one kilohertz signal for two times 24 hours at 90% humidity, with the common electrode connected to a positive potential and the driving electrodes 28 driven from a positve potential to ground. The result was a near degradation of the driving electrodes 28. On the other hand, degradation of the electrodes 25 occurred when the electrodes 28 were driven from ground to a positive potential, with the common electrodes 25 maintained at ground. Interestingly, no electrode degradation was observed when gates were kept permanently open by a constant potential. Optical and electron microscopic examinations, as well as X-rays analysis, showed a polarity-dependent dissolution of the chromium layer under the gold metallization, resulting in gradual lifting and blistering of the gold metallization, starting from the electrode edges, and suggesting a transport phenomenon within the particular electrode between the different layers thereof.

Several efforts were made to counteract this phenomenon by increasing the thickness of the electrode metallization and by using protective coatings, but none of these was particularly successful.

Of course, for the reasons mentioned above and in the literature, it was not reasonable to expect that a narrowing of the light gates would present a viable solution. However, notwithstanding such prior-art concerns, a solution was nevertheless found along these lines in conjunction with other features according to the subject invention as herein disclosed.

Figure 15:
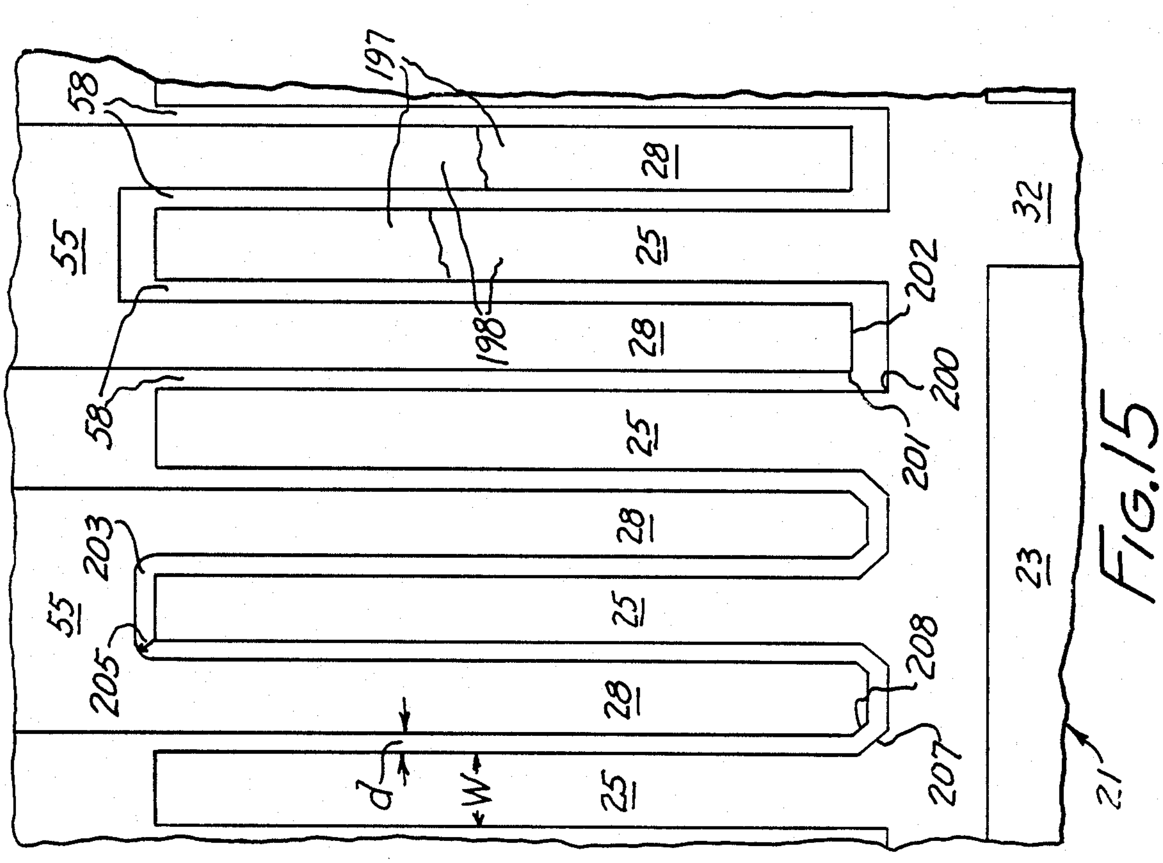
FIG. 15 is a view similar to FIG. 14 showing an improved electrode and light gate structure according to a preferred embodiment of the subject invention.

Reference may in this respect first be had to FIG. 15 of the drawings, which shows interdigitated electrodes 25 and 28 with a common terminal 32 and electrode group terminals 55, similar to FIG. 14, with each electrode 25 and 28 and each light gate region 58 being given a length several times larger than its width, and the lengths of the electrodes and of the light gate regions extending parallel to each other.

However, unlike the arrangement of FIG. 14, the preferred embodiment of the subject invention shown in FIG. 15 makes the light gate regions 58 individually narrower than the electrodes 25 or 28 by spacing each adjacent two of these electrodes 25 and 28 by a distance d smaller than the width w of each electrode 25 or 28 of the two electrodes 25 and 28. In other words, the ratio of electrode width w to interelectrode spacing or light gate width d is larger than unity.

If desired, the electrodes or electrode patterns shown in FIG. 15 may be provided on both major sides of the electrooptical light gate structure 21 or light gate material 23. However, in accordance with the preferred embodiment of the subject invention shown in FIG. 13, all of the electrodes 25, 28, etc., are arranged on only one side 176 of the layer of electrooptical light gate matetial 23. Further according to the preferred embodiment illustrated in the left-hand side of FIG. 13, the interelectrode gaps or light gate regions 58 are or are made individually narrower than the electrodes 25, 28 by spacing each adjacent two of these electrodes by a distance d smaller than the width w of each electrode of these two electrodes 25 and 28.

The light gate regions 58 are then electrically driven via the electrodes 25 and 28 as before, and photoinduced birefringence in the electrooptical material or light gate structure 21 is minimized by shining light 43 through the driven light gate regions 58 from a side 174 of the layer of electrooptical light gate material 23 opposite the one side 176 on which the electrodes 25, 28 are located.

Figure 16:
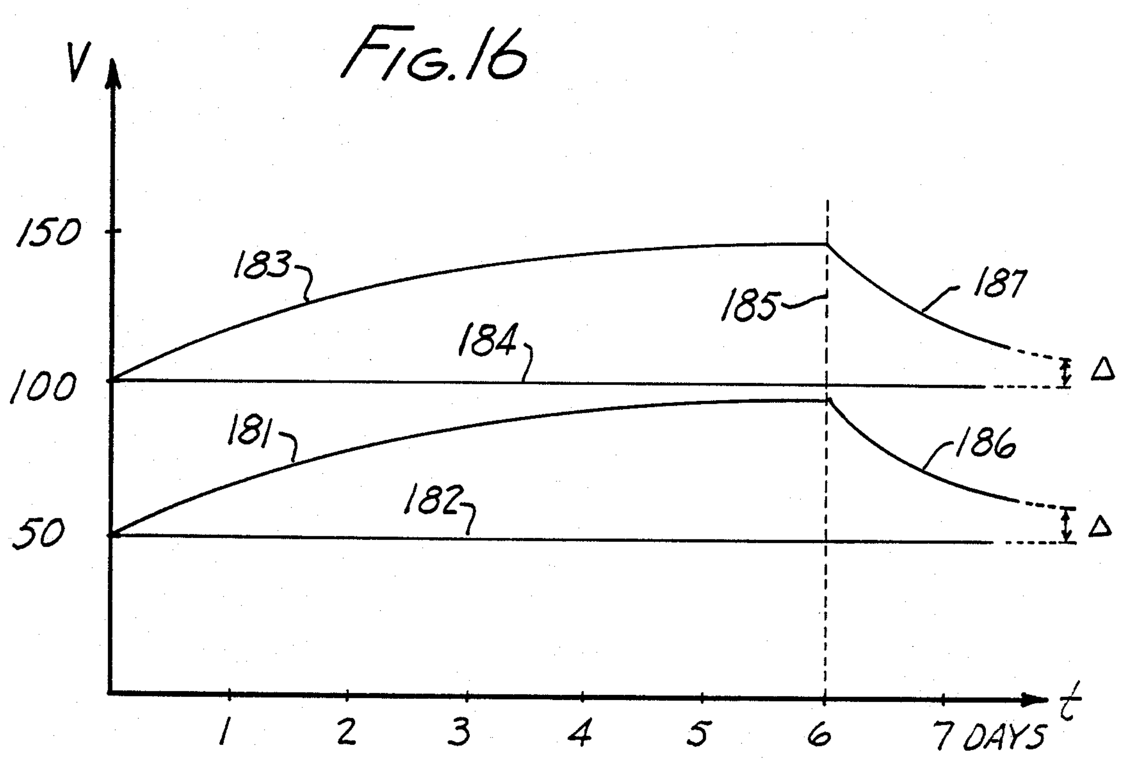
FIG. 16 is a voltage-versus-time graph showing photoinduced birefringence effects and their elimination according to a preferred embodiment of the subject invention.

Reference may now be had to FIG. 16 for a comparative illustration of the beneficial effects of the preferred embodiments or aspects of the subject invention presently under discussion.

In particular, FIG. 16 is a voltage-versus-time graph showing in a first set of curves 181 and 182 the minimum gate driving voltage required to record a leading edge of a square wave on a given oscillograph paper 47 and, in a second set of curves 183 and 184 the gate driving voltage at which photographic saturation of the oscillograph paper 47 occurs. The gate driving voltage thereby is the voltage applied to electrodes 25 and 28 adjacent a light gate region 58.

Curves 181 and 183 thereby show the gate driving voltage required in terms of operation of the light gate structure when such structure is illuminated from the side of the electrooptical layer 23 on which the electrodes 25, 28 are located. It may be recalled in this respect that such conventional front illumination is indicated by the dotted arrow 171 in FIG. 12, for instance.

Because of photoinduced birefringence, the gate driving voltage required to record the leading edge of a square wave becomes higher and higher, as shown by the curve 181, while the gate driving voltage required to darken the recording medium to saturation also becomes higher, as shown by the curve 183 in FIG. 16, as the light gate structure is being used over an extended period of time. Accordingly, as seen from FIG. 16, the performance of the light gate structure upon frontal illumination 171 degrades with progressing time because of photoinduced birefringence and a gate driving voltage of, for example, 50 volts or units of potential is after a while no longer able to record leading edges of square waves, while an initial gate driving voltage of 100 volts or units of potential is no longer able to saturate the recording medium for achievement of an optimally visible oscillograph trace or other recording.

In FIG. 16, a vertical line 185 indicates termination of an extended use of the light gate structure after six days or units of time. As apparent from the branches 186 and 187, termination of an extended exposure permits built-up space charges in the layer 23 to dissipate whereby the effects of photoinduced birefringence are diminished for both the minimum voltage 181 required to record the leading edge of a square wave and the approximate saturation voltage 183.

However, for both of these gate driving voltages there remains a birefringence effect Δ. In other words, with front gate illumination 171 there remains an effect that manifests itself by a permanent photoinduced birefringence in the material 23 impairing the sensitivity thereof. In practice, that permanent birefringence can only be cured by external means, such as by thermodepoling.

On the other hand, curves 182 and 184 show that the sensitivity of the light gate structure remains substantially constant, if the light gate structure 21 is illuminated from the back side 174 and if the light gate regions 58 are individually narrower than the electrodes 25, 28, as illustrated in the left-hand portion of FIG. 13 and also in FIG. 15. This substantial elimination of photoinduced birefringence through the currently discussed aspect of the invention is very remarkable, since nowhere derivable from the literature on the subject or from other prior art.

The effect of the narrow gates on the photoinduced birefringence phenomenon and on the electrode degradation can be rationalized as follows, though no limitation to a particular theory is intended thereby.

In particular, a dotted curve 191 in the right-hand portion of FIG. 13 shows the relative electric field intensity I for the electrode structure and separation shown therein, on the basis of a mathematical analysis of the field distribution in the gap between the electrodes 25 and 28. As shown by the curve 191, there are strong field intensity peaks 192 at the edges of the electrodes. It is believed that these field intensity peaks foster a generation of space charges which produce photoinduced birefringence.

With the relatively narrow gates 58 illustrated in the left-hand side of FIG. 13, the average field intensity at half-wave voltage increases, but the field intensity peaks 193 at the electrode edges nevertheless decrease considerably, as illustrated by the curve 194 in the left-hand side of FIG. 13, in contrast to the curve 191 in the right-hand side thereof.

In practice, this results in less photoinduced birefringence, which is light and field intensity dependent. At any rate, a combination of the back lighting feature shown in FIG. 13 with the narrow light gate and wide electrode feature of FIG. 15 results in a substantial reduction of photoinduced birefringence, as illustrated by the level curves 182 and 184 in FIG. 16.

At the same time, or independently from the back lighting feature, the narrow gate and wide electrode interrelationship results in a decrease and practical elimination of the type of electrode degradation illustrated in FIG. 14. I presently believe that this to a large extent is also explicable on the basis of the intensity curve 194 with its relatively low peaks 193, shown in the left-hand portion of FIG. 13, although I would not wish to be limited to any particular theory.

In this respect, reference may now again be had to FIG. 15.

In particular, two electrodes 25 and 28 in FIG. 15 are shown in a broken manner, to show the first electrode material 197 provided or deposited on the layer of electrooptical light gate material 23, as well as the second electrode material 198 provided or deposited on the first electrode material 197 in the course of providing the electrode patterns including electrodes 25 and 28 and their terminals 32 and 55, by such conventional technique as plating, sputtering or vacuum deposition, photolithography and etching.

As already mentioned above in connection with FIG. 14, the first electrode material 197 may be more electronegative than the second electrode material 198. By way of example only, the first electrode material 197 may be or comprise chromium, and the second electrode material 198 may be or comprise gold.

To inhibit the kind of electrode degradation illustrated in FIG. 14, the light gate regions 58 are made individually narrower than the electrodes 25, 28 by spacing each adjacent two of the electrodes 25 and 28 by a distance d smaller than the width w of each electrode of the two electrodes 25 and 28. As seen in the example shown in FIG. 15, the ratio of electrode width w to interelectrode distance or light gate width d is considerably larger than unity.

When the light gate structure of the type shown in FIG. 15 was subjected to the same test conditions as the light gate structure of the type shown in FIG. 14, over the same period of time and at the same humidity conditions, the electrode degradation shown in FIG. 14 did not occur in the structure of FIG. 15. In some instances, a slight electrode degradation could be observed at the complementary or vicinal corner regions 200 and 201 of the interdigitated first and second electrodes 25 and 28.

In particular, it was noted during extensive operation at high humidity that the ends of the type of electrodes shown at 202 in FIG. 15 showed some degradation in an incipient stage. According to a further preferred embodiment of the subject invention, even the latter type of electrode degradation could be eliminated by spacing the first and second electrodes 25 and 28 at any complementary corner region by the mentioned smaller distance d as shown, for instance, at 203 in FIG. 15.

In other words, the spacing between each adjacent two of the electrodes 25 and 28 by a distance d smaller than the width w of each electrode 25 or 28 is in the illustrated preferred embodiment not only effected laterally between each electrode pair, but also axially between, for instance, the electrode 25 and an extended portion 55 of the electrode 28, as well as diagonally at the corner region 203 between such electrodes or electrode portions.

As shown by way of example in FIG. 15, the corner region of the electrode 28 and its integral terminal 55 may be spaced from the adjacent corner of the electrode 25 by a radius 205 equal to the preferred smaller interelectrode distance d throughout the corner. Instead of the rounded corner region shown at 205, blunted or polygonal corner regions may be employed. In this respect, at least corner regions of one of the first and second electrodes 25 and 28 may be blunted.

Polygonal corner regions are shown at 207 and 208 in FIG. 15 as preserving interelectrode spacings essentially equal to the preferred smaller distance d.

It should be understood in this connection that the electrode structure and structural features shown in FIG. 15 may be employed with the type of light gate illumination indicated by the dotted arrow 171 in FIG. 12. Similarly, the light gate structure 21 of the type shown in FIG. 14 may, for instance, be illuminated in the manner shown by the solid arrow 172 in FIG. 12 and also in the right-hand portion of FIG. 13, in order to inhibit photoinduced birefringence and to achieve a certain reduction of electrode degradation.

However, for best overall results, use of the type of light gate and electrode structure shown in FIG. 15 with the back illumination of the type shown in the left-hand portion of FIG. 13 is preferred, and reference may in this respect be had to the flat and stable graphs 182 and 184 of FIG. 16.

Figure 17:
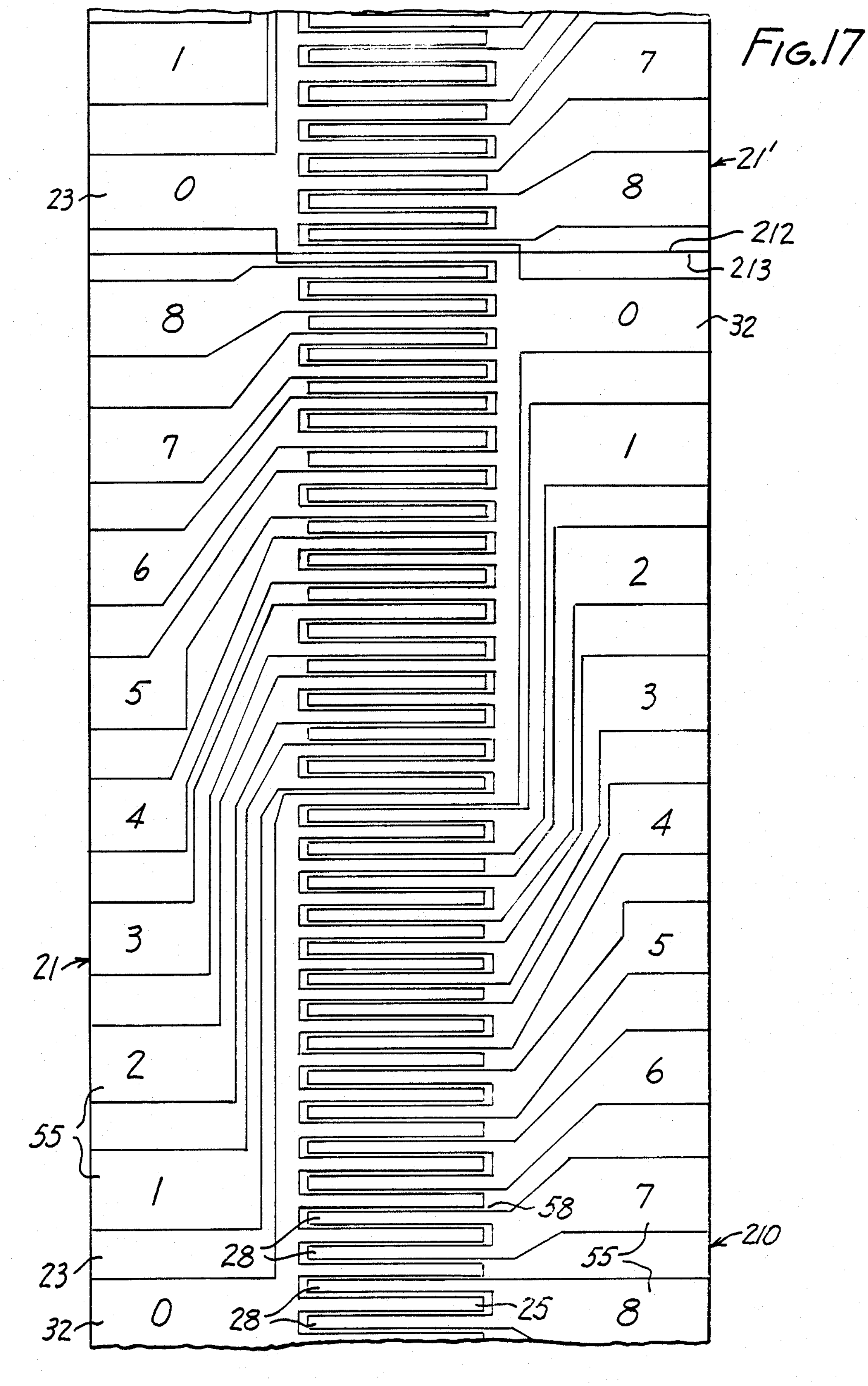
FIG. 17 is a fractional plan view of light gate structures improved according to a preferred embodiment of the subject invention.

An electrode structure of the type depicted on an enlarged scale in FIG. 15, is shown in FIG. 17 in the setting of a particularly advantageous light gate structure 21. That electrooptical light gate structure shown in FIG. 17 has not only the interdigitated electrodes 25 and 28 at their interelectrode spacing d smaller than the width w of each electrode, but also has interconnecting and terminal portions 32 and 55 arranged on both sides of the electrode array in a manner making optimum use of available space and light gate driving circuitry. The common terminals 32 for the common electrodes 25 are designated by the cipher "0," while the group terminals 55 are designated by numerals "1" through "8" in FIG. 17.

The electrooptical light gate structure 21 of FIG. 17 may, of course, be used in the structure of FIG. 12 or system of FIG. 13. In this respect, the electrode 21 may be duplicated or otherwise complemented, as indicated at 21' in FIG. 17. In this respect, an elongate light gate structure 210 may be provided of a plurality of individual wafers or chips 21, 21', etc., including electrooptically active light gate material 23 displaying field induced birefringence.

In particular, as apparent from FIG. 17, the chips may be provided in rectangular configuration. On each chip a plurality of alternating electrodes 25 and 28 is provided on only one side of the light gate material 23, and elongate light gate regions 58 extend parallel to opposite sides 212 and 213 of the rectangular chips. As shown in FIG. 12, a rigid beam 152 may be provided with a pair of spaced parallel elongate mounting surfaces 155 and 156 and an elongate opening 157 located between and extending along these mounting surfaces. The chips 21, 21', etc., are mounted side by side on or along the pair of mounting surfaces 155 and 156 with the light gate regions 58 registering with the opening 157 in the beam 154. The light gate regions 58 are electrically driven via the electrodes 25 and 28, and photoinduced birefringence is minimized by shining light through the driven light gate regions from a side 174 of the light gate material 23 located opposite the one side 176 on which the electrodes 25 and 28 are located. In brief, the light gate structures 21 and 21' shown in FIG. 17 may be mounted as shown in FIG. 12 and illuminated from their back side as illustrated by the solid arrow 172 in FIG. 12 or as shown more generally in FIG. 13.

Contrary to a previously prevailing rule of thumb, the electrodes 25 and 28 may be spaced from each other by an interelectrode distance smaller than one half the thickness of the light gate material 23.

The subject extensive disclosure suggests or renders apparent to those skilled in the art various modifications and variations within the spirit and scope of the subject invention and equivalents thereof.

I claim:

1. In a method of inhibiting spurious cross-energization between light gates of an elongate electrooptical light gate structure, the improvement comprising in combination the steps of:

providing along an elongate first region of said light gate structure a series of spaced first opaque electrodes extending transversely of said elongate first region;

providing along an elongate second region adjacent said first region of said light gate structure a series of spaced second opaque electrodes extending transversely of said elongate second region;

staggering said second electrodes relative to said first electrodes;

interdigitating with said spaced first electrodes spaced third electrodes extending transversely of said elongate first region for providing first light gates between said first and third electrodes operating in a transverse birefringent mode;

interdigitating with said spaced second electrodes spaced fourth electrodes extending transversely of said elongate second region for providing second light gates between said second and fourth electrodes operating in a transverse birefringent mode;

staggering said fourth electrodes relative to said third electrodes; and interconnecting said first and second electrodes with a conductor extending between and along said elongate first and second regions.

2. A method as claimed in claim 1, including the steps of:

giving each of said first electrodes a predetermined width; and spacing each adjacent two of said second electrodes by a distance equal to said width.

3. A method as claimed in claim 2, including the steps of:

giving each of said second electrodes a predetermined second electrode width; and spacing each adjacent two of said first electrodes by a distance equal to said second electrode width.

4. A method as claimed in claim 1, including the steps of:

giving each of said first electrodes and each of said second electrodes a predetermined width; and spacing each adjacent two of said first electrodes and each adjacent two of said second electrodes by a distance equal to said width.

5. A method as claimed in claim 1, including the steps of:

spacing said first electrodes from each other by a distance smaller than a width of said second electrodes;

spacing said second electrodes from each other by a distance smaller than a width of said first electrodes.

6. A method as claimed in claim 1, including the steps of:

exposing said light gate structure to light;

selectively energizing said first, second, third and fourth electrodes for gating light through said gate structure; and imaging said gated light onto a surface.

7. A method as claimed in claim 6, wherein:

said imaging includes the step of focusing the light to which said light gate structure is exposed.

8. A method as claimed in claim 6, wherein:

said imaging includes a step of focusing said gated light from said first region and said gated light from said second region onto said common image area.

9. A method as claimed in claim 1, including the steps of:

exposing said light gate structure to light;

selectively energizing said first and third electrodes for gating light through selected portions of said first region;

selectively energizing said second and fourth electrodes for gating light through selected portions of said second region; and imaging said gated light from said first region and said gated light from said second region onto an elongate image area common to said first and second regions.

10. A method as claimed in claim 1, including the steps of:

providing said light gates with a predetermined electrooptically active light gate material having a dielectric constant;

providing said light gate structure outside of light gates at said elongate first region with a first dielectric layer having a dielectric constant lower than the dielectric constant of said electrooptically active light gate material;

providing said light gate structure outside of light gates at said elongate second region with a second dielectric layer having a dielectric constant lower than the dielectric constant of said electrooptically active light gate material;

providing said third electrodes with first terminal means on said first dielectric layer; and providing said fourth electrode with second terminal means on said second dielectric layer.

11. A method as claimed in claim 10, including the steps of:

permanently blocking light from penetrating said light gate structure at said first terminal means and at said second terminal means.

12. A method as claimed in claim 1, including the steps of:

providing said third electrodes with first terminal means at said elongate first region;

providing said fourth electrodes with second terminal means at said elongate second region; and permanently blocking light from penetrating said light gate structure at said first terminal means and at said second terminal means.

13. A method as claimed in claim 1, including the step of:

blocking light from each of said first and second regions from penetrating portions of said light gate structure located transversely of said light gates in any other of said regions.

14. A method as claimed in claim 13, including the step of:

employing said first and second opaque electrodes for effecting said blocking of light.

15. In an elongate electrooptical light gate structure, the improvement comprising in combination:

a series of spaced opaque first light gate electrodes extending along an elongate first region of said light gate structure and transversely of said elongate first region;

a series of spaced opaque second light gate electrodes extending along an elongate second region adjacent said first region of said light gate structure and extending transversely of said elongate second region;

said second electrodes being staggered relative to said first electrodes;

means for providing first light gates operating in a transverse birefringent mode, including spaced third electrodes interdigitated with said spaced first electrodes and extending transversely of said elongate first region;

means for providing second light gates operating in a transverse birefringent mode, including spaced fourth electrodes interdigitated with said spaced second electrodes and extending transversely of said elongate second region;

said fourth electrodes being staggered relative to said third electrodes; and said light gate structure including a conductor extending between and along said elongate first and second regions for interconnecting said first and second electrodes.

16. Apparatus as claimed in claim 15, wherein:
each of said first electrodes has a predetermined width; and
each adjacent two of said second electrodes are spaced by a distance equal to said width.

17. Apparatus as claimed in claim 16, wherein:
each of said second electrodes has a predetermined second electrode width; and
each adjacent two of said first electrodes are spaced by a distance equal to said second electrode width.

18. Apparatus as claimed in claim 15, wherein:
each of said first electrodes and each of said second electrodes have a predetermined width; and
each adjacent two of said first electrodes and each adjacent two of said second electrodes are spaced by a distance equal to said width.

19. Apparatus as claimed in claim 15, wherein:
said first electrodes are spaced from each other by a distance smaller than a width of said second electrodes; and
said second electrodes are spaced from each other by a distance smaller than a width of said first electrodes.

20. Apparatus as claimed in claim 15, including:
means for exposing said light gate structure to light;
means connected to said first, second, third and fourth electrodes for selectively energizing said first, second, third and fourth electrodes for gating light through said gate structure; and
means for imaging said gated light onto a surface.

21. Apparatus as claimed in claim 20, wherein:
said imaging means include means for focusing the light to which said light gate structure is exposed.

22. Apparatus as claimed in claim 20, wherein:
said imaging means include means for focusing said gated light from said first region and said gated light from said second region onto said common image area.

23. Apparatus as claimed in claim 15, including:
means for exposing said light gate structure to light;
means connected to said first and third electrodes for selectively energizing said first and third electrodes for gating light through selected portions of said first region;

means connected to said second and fourth electrodes for selectively energizing said second and fourth electrodes for gating light through selected portions of said second region; and
means for imaging said gated light from said first region and said gated light from said second region onto an elongate image area common to said first and second regions.

24. Apparatus as claimed in claim 15, including:
a predetermined electrooptically active light gate material in said light gates, having a dielectric constant;
a first dielectric layer having a dielectric constant lower than the dielectric constant of said electrooptically active light gate material and being located on said light gate structure outside of light gates at said elongate first region;
a second dielectric layer having a dielectric constant lower than the dielectric constant of said electrooptically active light gate material and being located on said light gate structure outside of light gates at said elongate second region;
first terminal means on said first dielectric layer for said third electrodes; and
second terminal means on said second dielectric layer for said fourth electrodes.

25. Apparatus as claimed in claim 24, including:
means for permanently blocking light from penetrating said light gate structure at said first terminal means and at said second terminal means.

26. Apparatus as claimed in claim 15, including:
first terminal means at said elongate first region for said third electrodes;
second terminal means at said elongate second region for said fourth electrodes; and
means for permanently blocking light from penetrating said light gate structure at said first terminal means and at said second terminal means.

27. Apparatus as claimed in claim 15, including:
means for blocking light from each of said first and second regions from penetrating portions of said light gate structure located transversely of light gates in any other of said regions.

28. Apparatus as claimed in claim 27, wherein:
said means for said blocking of light include said opaque first and second light gate electrodes.

* * * * *